United States Patent
Abatchev et al.

(10) Patent No.: US 10,446,394 B2
(45) Date of Patent: Oct. 15, 2019

(54) SPACER PROFILE CONTROL USING ATOMIC LAYER DEPOSITION IN A MULTIPLE PATTERNING PROCESS

(71) Applicant: Lam Research Corporation, Fremont, CA (US)

(72) Inventors: Mirzafer Abatchev, Fremont, CA (US); Qian Fu, Pleasanton, CA (US); Yoko Yamaguchi, Union City, CA (US); Aaron Eppler, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/881,506

(22) Filed: Jan. 26, 2018

(65) Prior Publication Data

US 2019/0237330 A1    Aug. 1, 2019

(51) Int. Cl.
*H01L 21/033*    (2006.01)
*H01L 21/02*    (2006.01)
*H01L 21/311*    (2006.01)

(52) U.S. Cl.
CPC ...... *H01L 21/0337* (2013.01); *H01L 21/0228* (2013.01); *H01L 21/02164* (2013.01); *H01L 21/02274* (2013.01); *H01L 21/02323* (2013.01); *H01L 21/31116* (2013.01)

(58) Field of Classification Search
CPC ............. H01L 21/0337; H01L 21/0228; H01L 21/31116; H01L 21/02323; H01L 21/02274; H01L 21/02164
See application file for complete search history.

(56) References Cited

U.S. PATENT DOCUMENTS

| 8,334,083 | B2 | 12/2012 | Luong et al. |
| 9,171,716 | B2 | 10/2015 | Fukuda |
| 9,269,590 | B2 | 2/2016 | Luere et al. |
| 9,576,811 | B2 | 2/2017 | Kanarik et al. |

(Continued)

FOREIGN PATENT DOCUMENTS

WO    WO 2017/048275    3/2017

OTHER PUBLICATIONS

U.S. Appl. No. 15/820,108, filed Nov. 21, 2017, Zhou et al.

(Continued)

*Primary Examiner* — John P. Dulka
(74) *Attorney, Agent, or Firm* — Weaver Austin Villeneuve & Sampson LLP

(57) ABSTRACT

Methods and apparatuses for spacer profile control using atomic layer deposition (ALD) in multi-patterning processes are described herein. A silicon oxide spacer is deposited over a patterned core material and a target layer of a substrate in a multi-patterning scheme. A first thickness of the silicon oxide spacer is deposited by multiple ALD cycles under a first oxidation condition that includes an oxidation time, a plasma power, and a substrate temperature. A second thickness of the silicon oxide spacer is deposited by multiple ALD cycles under a second oxidation condition, where the second oxidation condition is different than the first oxidation condition by one or more parameters. After etching the patterned core material, a resulting profile of the silicon oxide spacer is dependent at least in part on the first and second oxidation conditions.

22 Claims, 16 Drawing Sheets

(56) References Cited

U.S. PATENT DOCUMENTS

| | | |
|---|---|---|
| 9,805,941 B2 | 10/2017 | Kanarik et al. |
| 9,806,252 B2 | 10/2017 | Tan et al. |
| 9,870,899 B2 | 1/2018 | Yang et al. |
| 9,997,371 B1 | 6/2018 | Agarwal |
| 9,997,631 B2 | 6/2018 | Yang et al. |
| 10,074,543 B2* | 9/2018 | Mahorowala ....... H01L 21/0337 |
| 2005/0048785 A1 | 3/2005 | Kang et al. |
| 2007/0196980 A1 | 8/2007 | Subramanian |
| 2008/0230947 A1 | 9/2008 | Chou et al. |
| 2009/0197420 A1 | 8/2009 | Luong et al. |
| 2009/0206443 A1 | 8/2009 | Juengling |
| 2009/0233446 A1 | 9/2009 | Sakao et al. |
| 2009/0246965 A1 | 10/2009 | Mori et al. |
| 2009/0275205 A1 | 11/2009 | Kiehlbauch et al. |
| 2010/0173496 A1 | 7/2010 | Zhong et al. |
| 2010/0323525 A1 | 12/2010 | Chi et al. |
| 2012/0264305 A1* | 10/2012 | Nakano ............... H01L 21/0273 438/694 |
| 2013/0189845 A1* | 7/2013 | Kim .................. H01L 21/02115 438/696 |
| 2013/0323923 A1* | 12/2013 | Koehler ............. H01L 21/0217 438/595 |
| 2014/0213037 A1 | 7/2014 | LiCausi et al. |
| 2014/0252478 A1 | 9/2014 | Doornbos et al. |
| 2015/0102386 A1 | 4/2015 | Chen et al. |
| 2015/0187602 A1* | 7/2015 | Kim .................... H01L 21/0337 428/195.1 |
| 2015/0249018 A1 | 9/2015 | Park et al. |
| 2015/0322569 A1 | 11/2015 | Kilpi et al. |
| 2016/0056270 A1 | 2/2016 | Dal |
| 2016/0064379 A1 | 3/2016 | Yu |
| 2016/0111309 A1 | 4/2016 | Lill et al. |
| 2016/0126243 A1 | 5/2016 | Weis |
| 2016/0307769 A1* | 10/2016 | Tseng ................ H01L 21/31144 |
| 2016/0336178 A1 | 11/2016 | Swaminathan et al. |
| 2016/0365425 A1* | 12/2016 | Chen ................... H01L 29/6653 |
| 2016/0379824 A1 | 12/2016 | Wise et al. |
| 2017/0229314 A1 | 8/2017 | Tan et al. |
| 2018/0019387 A1 | 1/2018 | Tan et al. |
| 2018/0033635 A1 | 2/2018 | Kanarik et al. |
| 2018/0061650 A1* | 3/2018 | Mahorowala ....... H01L 21/0337 |
| 2018/0240667 A1* | 8/2018 | Yu ....................... H01L 21/0332 |
| 2018/0308680 A1 | 10/2018 | Reddy et al. |
| 2019/0157066 A1 | 5/2019 | Zhou et al. |
| 2019/0157095 A1 | 5/2019 | Zhou et al. |
| 2019/0157096 A1 | 5/2019 | Zhou et al. |

OTHER PUBLICATIONS

U.S. Appl. No. 15/820,110, filed Nov. 21, 2017, Zhou et al.
U.S. Appl. No. 15/820,263, filed Nov. 21, 2017, Zhou et al.
U.S. Office Action dated Dec. 11, 2018, issued in U.S. Appl. No. 15/820,263.
International Search Report and Written Opinion dated May 14, 2019 in Application No. PCT/US2019/014580.
U.S. Notice of Allowance dated Apr. 4, 2019 issued in U.S. App. No. 15/820,263.
International Search Report and Written Opinion dated Mar. 6, 2019 in Application No. PCT/US2018/060732.
International Search Report and Written Opinion dated Mar. 6, 2019 in Application No. PCT/US2018/060739.
International Search Report and Written Opinion dated Mar. 5, 2019 in Application No. PCT/US2018/060743.

* cited by examiner

SPACER PROFILE CONTROL USING ATOMIC LAYER DEPOSITION IN A MULTIPLE PATTERNING PROCESS

TECHNICAL FIELD

This disclosure relates generally to multiple patterning processes in the fabrication of semiconductor devices and, more particularly, to profile control of spacers and masks using atomic layer deposition in multiple patterning processes.

BACKGROUND

Fabrication of advanced integrated circuits often involves patterning of small features in high volume manufacturing of semiconductors. Multiple patterning techniques may enable feature size scaling based on lithographic techniques such as 193 nm immersion lithography. Self-aligned double patterning is an example of a multiple patterning technique.

SUMMARY

This disclosure pertains to a method for controlling a slope of a plurality of spacers. The method includes depositing in a plasma chamber, a first thickness of a silicon oxide spacer layer by atomic layer deposition (ALD) on a substrate including a patterned core material and a target layer underlying the patterned core material, and depositing, in the plasma chamber, a second thickness of the silicon oxide spacer layer by ALD on the substrate. Depositing the first thickness of the silicon oxide spacer layer by ALD includes exposing the substrate to a first dose of a silicon-containing precursor and exposing the substrate to plasma of an oxidant under a first oxidation condition. Depositing the second thickness of the silicon oxide spacer layer by ALD includes exposing the substrate to a second dose of the silicon-containing precursor and exposing the substrate to plasma of the oxidant under a second oxidation condition, where the second oxidation condition is different from the first oxidation condition. The method further includes etching, in the plasma chamber, the patterned core material to form a plurality of spacers from the silicon oxide spacer layer, wherein the plurality of spacers serve as a mask for the target layer.

In some implementations, the second oxidation condition is different from the first oxidation condition by one or more of the following: (1) an oxidation time, (2) a radio-frequency (RF) power, and (3) a substrate temperature. In some implementations, the second oxidation condition includes a second oxidation time and a second RF power and the first oxidation condition includes a first oxidation time and a first RF power, the second oxidation time being greater than the first oxidation time and the second RF power being greater than the first RF power. In some implementations, the second oxidation condition includes a second oxidation time and a second RF power and the first oxidation condition includes a first oxidation time and a first RF power, the second oxidation time being less than the first oxidation time and the second RF power being less than the first RF power. In some implementations, the second oxidation condition includes a second substrate temperature and the first oxidation condition includes a first substrate temperature, wherein the second substrate temperature is different from the first substrate temperature. The method may further include ramping a temperature of a substrate support from the first substrate temperature to the second substrate temperature. In some implementations, operations of depositing the first thickness of the silicon oxide spacer layer, depositing the second thickness of the silicon oxide spacer layer, and etching the patterned core material occur in the plasma chamber without introducing a vacuum break in between operations. In some implementations, a pressure in the plasma chamber is between about 1 mTorr and about 100 mTorr. In some implementations, depositing the first thickness of the silicon oxide spacer layer includes applying X number of cycles of: (i) exposing the substrate to the first dose of the silicon-containing precursor, and (ii) exposing the substrate to the plasma of the oxidant under the first oxidation condition, and where depositing the second thickness of the silicon oxide spacer layer includes applying Y number of cycles of: (iii) exposing the substrate to the second dose of the silicon-containing precursor, and (iv) exposing the substrate to the plasma of the oxidant under the second oxidation condition, where X and Y are integer values different from one another. The first oxidation condition may include a first oxidation time and the second oxidation condition may include a second oxidation time, the first oxidation time gradually changing across the X number of cycles and the second oxidation time gradually changing across the Y number of cycles. In some implementations, the first oxidation condition may include a first RF power and the second oxidation condition may include a second RF power, the first RF power gradually changing across the X number of cycles and the second RF power gradually changing across the Y number of cycles. In some implementations, an upper portion of each of the plurality of spacers has a slope, where the slope is dependent at least in part on the first oxidation condition and the second oxidation condition.

This disclosure also pertains to an apparatus for controlling a slope of a plurality of silicon oxide spacers. The apparatus includes a plasma chamber, an RF power supply coupled to the plasma chamber and configured to deliver RF power to the plasma chamber, a substrate support for supporting a substrate in the plasma chamber, where the substrate includes a patterned core material and a target layer under the patterned core material, and a controller. The controller is configured to provide instructions for performing the following operations: (i) deposit, in the plasma chamber, a first thickness of a silicon oxide spacer layer by atomic layer deposition (ALD) on the substrate, where depositing the first thickness of the silicon oxide spacer layer by ALD includes exposing the substrate to a first dose of a silicon-containing precursor and exposing the substrate to plasma of an oxidant under a first oxidation condition; (ii) deposit, in the plasma chamber, a second thickness of the silicon oxide spacer layer by ALD on the first thickness of the silicon oxide spacer layer, where depositing the second thickness of the silicon oxide spacer layer by ALD includes exposing the substrate to a second dose of the silicon-containing precursor and exposing the substrate to plasma of the oxidant under a second oxidation condition, the second oxidation condition being different from the first oxidation condition; and (iii) etch, in the plasma chamber, the patterned core material to form a plurality of silicon oxide spacers from the silicon oxide spacer layer, where the plurality of silicon oxide spacers serve as a mask for the target layer.

In some implementations, the second oxidation condition is different from the first oxidation condition by one or more of the following: (1) an oxidation time, (2) a radio-frequency (RF) power, and (3) a substrate temperature. In some implementations, an upper portion of each of the plurality of silicon oxide spacers has a slope, where the slope is dependent at least in part on the first oxidation condition and the second oxidation condition.

These and other aspects are described further below with reference to the drawings.

DETAILED DESCRIPTION

Introduction

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Integrated Etch/ALD Processing Apparatus

As feature sizes shrink, pitch becomes smaller, and complementary metal-oxide-semiconductor (CMOS) technology scales to smaller nodes, thin conformal deposition techniques will continue to gain importance. Atomic layer deposition (ALD) is a film forming technique which is well-suited to the deposition of thin conformal films due to the fact that ALD deposits a single thin layer of material, the thickness being limited by the amount of one or more precursor reactants which may adsorb onto a substrate surface (i.e., forming an adsorption-limited layer) prior to film-forming chemical reaction itself. Each layer formed by ALD is thin and conformal, with the resulting film substantially conforming to the shape of underlying device structures and features.

Conventionally, ALD and etch processes are performed on separate tools or platforms. For example, ALD chambers do not run etch processes, and etch chambers do not run ALD processes. Plasma etch chambers that run a deposition process use a plasma-induced deposition process to form films that are not conformal and that are aspect ratio dependent.

Figure 1:
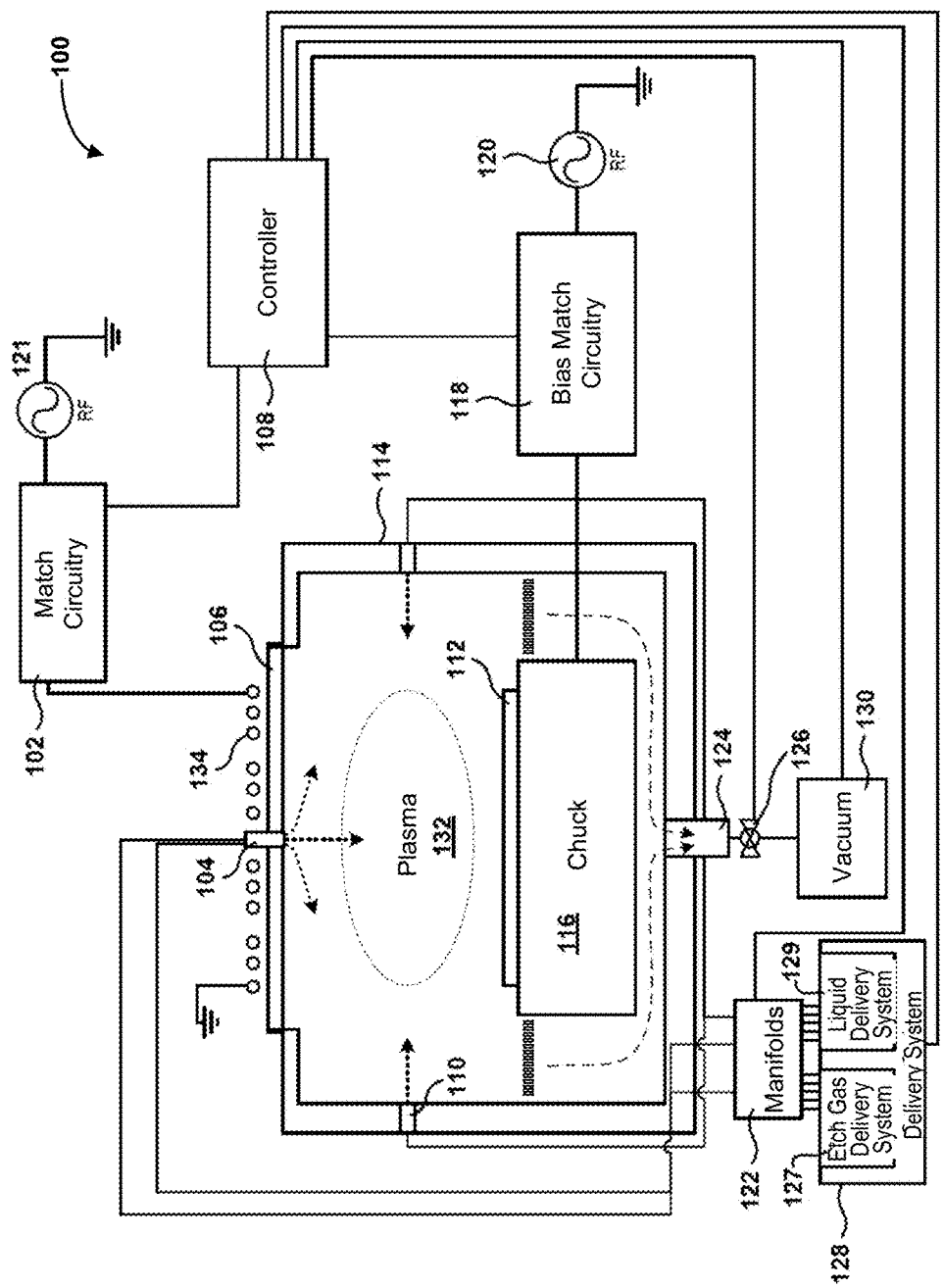
FIG. 1 is a schematic diagram of an example processing apparatus for performing etch and ALD operations according to some implementations.

FIG. 1 is a schematic diagram of an example processing apparatus for performing etch and ALD operations according to some implementations. The processing apparatus 100 may be an inductively coupled plasma processing apparatus. The processing apparatus 100 includes a plasma chamber 132 such as a plasma etch chamber. In some implementations, a Kiyo® reactor, produced by Lam Research Corporation of Fremont, Calif., is an example of a suitable reactor that may be used as the plasma etch chamber.

Details regarding the processing apparatus 100 for performing etch and ALD operations are described in U.S. patent application Ser. No. 15/669,871, filed Aug. 4, 2017 to Zhou et al., and entitled "INTEGRATED ATOMIC LAYER PASSIVATION IN TCP ETCH CHAMBER AND IN-SITU ETCH-ALP METHOD," which is incorporated by reference in its entirety and for all purposes.

The plasma chamber 132 may include an overall chamber structure that may be defined by chamber walls 114 and a window 106. The window 106 may be fabricated from quartz or other dielectric material. In some implementations, the plasma chamber 132 includes a substrate support 116 disposed inside the plasma chamber 132. In some implementations, the substrate support 116 is an electrostatic chuck for supporting a substrate 112 upon which a deposition/etch process is performed. The electrostatic chuck may include electrostatic electrodes for chucking and dechucking the substrate 112. A filter and DC clamp power supply (not shown) may be provided for this purpose. Other control systems for lifting the substrate 112 off the substrate support 116 may also be provided. The substrate support 116 is configured to receive and hold the substrate 112.

In some implementations, the substrate support 116 may include a heater (not shown) to heat the substrate 112. The substrate support 116 may operate at elevated temperatures, such as between about −20° C. and about 150° C. The temperature will depend on the process operation and specific recipe. In some implementations, the plasma chamber 132 may also operate at certain pressures, such as pressures in between about 1 mTorr and about 1 Torr.

In some implementations, the processing apparatus 100 may include a radio-frequency (RF) power supply 120 that may be used for biasing/charging the substrate support 116. The RF power supply 120 may be defined by one or more RF generators. If multiple RF generators are provided, different frequencies may be used to achieve various tuning characteristics. A bias matching circuitry 118 is coupled between the RF power supply 120 and the substrate support 116. In this manner, the RF power supply 120 is connected to the substrate support 116.

A coil 134 is positioned over the window 106. The coil 134 may be fabricated from an electrically conductive material and includes at least one complete turn. The coil 134 shown in FIG. 1 includes at least three turns. An RF power supply 121 is configured to supply RF power to the coil 134. A matching circuitry 102 is coupled between the RF power supply 121 and the coil 134. In this manner, the RF power supply 121 is connected to the coil 134. In some implementations, an optional Faraday shield (not shown) is positioned between the coil 134 and the window 106. The Faraday shield may be maintained in a spaced apart relationship relative to the coil 134. The Faraday shield may be disposed immediately above the window 106. The Faraday shield may prevent metal or other species from depositing on the window 106 of the plasma chamber 132.

RF power is supplied from the RF power supply 121 to the coil 134 to cause an RF current to flow through the coil 134. The RF current flowing through the coil 134 may generate an electromagnetic field about the coil 134. The electromagnetic field generates an inductive current within the plasma chamber 132 that acts on the gas(es) present in the plasma chamber 132 to produce a plasma. Various ions and/or radicals from the plasma may interact with the substrate 112 to perform a deposition or etch operation.

In some implementations, the processing apparatus 100 optionally includes a plasma grid (not shown) that may be used to divide the plasma chamber 132 into an upper portion and a lower portion. The plasma grid may be used to limit the amount of hot electrodes into the lower portion of the plasma chamber 132. In some implementations, the processing apparatus 100 is designed to operate such that plasma present in the lower portion of the plasma chamber 132 is an ion-ion plasma and the plasma present in the upper portion of the plasma chamber 132 is an electron-ion plasma.

Process gases may be introduced into the plasma chamber 132 through a first gas injector 104 from the top of the plasma chamber 132 and/or through a second gas injector 110 from the side of the plasma chamber 132. Process gases may include vaporized liquid precursors or vaporized solid precursors, which may be vaporized in a solid source evaporator (not shown) upstream of the processing apparatus 100. One or more reactant gases may be supplied through the first gas injector 104 and/or second gas injector 110. In some implementations, the gas injectors 104, 110 may be replaced by showerheads. It will be understood that additional or other gas supplies may be provided for supplying different gases to the plasma chamber 132 for various types of operations.

The various ways of injecting gas(es) into the plasma chamber 132 show that process gases, vaporized liquid precursors, and/or vaporized solid precursors may be provided into the plasma chamber 132 from various locations. In some implementations, only the first gas injector 104 is used. In some other implementations, only the second gas injector 110 is used. In some other implementations, both the first gas injector 104 and the second gas injector 110 are used. In some implementations, manifolds 122 control which gases are supplied to each of the different gas lines. Manifolds 122 allow for any type of gas (reactant, carrier, precursor, etc.) to be provided from any of the different gas lines. In some implementations, carrier gases can include gases such as oxygen ($O_2$), nitrogen ($N_2$), argon (Ar) and helium (He). The gases may be introduced into the plasma chamber 132 without mixing or may be mixed with other gases before introduction into the plasma chamber 132.

Manifolds 122 may be used for selecting, switching, and/or mixing outputs from respective delivery systems in a delivery system 128. The delivery system 128 may, in some implementations, include an etch gas delivery system 127 and a liquid delivery system 129. The etch gas delivery system 127 may be configured to output etchant gases. Examples of etchant gases include but are not limited to chlorine ($Cl_2$), hydrogen bromide (HBr), and sulfur hexafluoride ($SF_6$). The liquid delivery system 129 may be configured to provide liquid precursor that is vaporized and delivered in vapor form in an ALD process. The vaporized liquid precursor may be introduced into the plasma chamber 132 and may adsorb onto a surface of the substrate 112. The adsorbed precursor may be converted to form an adsorption-limited amount of film using a plasma. An example liquid precursor may have a chemical composition of the formula: $C_xH_yN_zO_aSi_b$.

A vacuum pump 130 is connected to the plasma chamber 132 and may be used to draw out process gases from the plasma chamber 132 and to maintain a certain pressure within the plasma chamber 132. A valve 126 may be disposed between an exhaust 124 and the vacuum pump 130 to control the amount of vacuum suction being applied to the plasma chamber 132. In some implementations, the vacuum pump 130 can be a one or two stage mechanical dry pump and/or turbomolecular pump. In some implementations, the vacuum pump 130 may be activated after each time an ALD process is completed to purge the plasma chamber 132.

The processing apparatus 100 may be coupled to facilities (not shown) when installed in a clean room or a fabrication facility. Facilities include plumbing that provide processing gases, vacuum, temperature control, and environmental particle control. These facilities may be coupled to the processing apparatus 100 when installed in the target fabrication facility. Additionally, the processing apparatus 100 may be coupled to a transfer chamber that allows robotics to transfer substrates into and out of the plasma chamber 132 using automation.

In some implementations, a system controller 108 (which may include one or more physical or logical controllers) controls some or all of the operations of the processing apparatus 100. The system controller 108 may include one or more memory devices and one or more processors. The processor may include a central processing unit (CPU) or computer, analog and/or digital input/output connections, stepper motor controller boards, and other like components.

Instructions for implementing appropriate control operations are executed on the processor. These instructions may be stored on the memory devices associated with the system controller 108 they may be provided over a network. In certain implementations, the system controller 108 executes system control software.

The system control software may include instructions for controlling the timing of application and/or magnitude of any one or more of the following chamber operational conditions: the mixture and/or composition of gases, chamber pressure, chamber temperature, wafer/wafer support temperature, the bias applied to the substrate (which in various implementations may be zero), the frequency and power applied to coils or other plasma generation components, substrate position, substrate movement speed, and other parameters of a particular process performed by the tool. System control software may be configured in any suitable way. For example, various process tool component subroutines or control objects may be written to control operations of the process tool components necessary to carry out various process tool processes. System control software may be coded in any suitable compute readable programming language.

In some embodiments, system control software includes input/output control (IOC) sequencing instructions for controlling the various parameters described above. For example, each phase of a semiconductor fabrication process may include one or more instructions for execution by the system controller 108. The instructions for setting process conditions for a phase may be included in a corresponding recipe phase, for example. In some implementations, the recipe phases may be sequentially arranged, such that steps in a doping process are executed in a certain order for that process phase. For example, a recipe may be configured to perform etch operations and include one or more cycles of an ALD process performed in between each of the etch operations.

In some implementations, the system controller 108 is configured with instructions for performing one or more of the following operations: (i) depositing, in the plasma chamber 132, a first thickness of a silicon oxide spacer layer by ALD on a substrate 112 including a patterned core material and a target layer underlying the core material, where depositing the first thickness includes exposing the substrate 112 to a first dose of a silicon-containing precursor and exposing the substrate 112 to plasma of an oxidant under a first oxidation condition; (ii) depositing, in the plasma chamber 132, a second thickness of the silicon oxide spacer layer by ALD on the substrate 112, where depositing the second thickness includes exposing the substrate 112 to a second dose of the silicon-containing precursor and exposing the substrate 112 to plasma of the oxidant under a second oxidation condition, the second oxidation condition being different from the first oxidation condition; and (iii) etching, in the plasma chamber 132, the patterned core material to form a plurality of spacers from the silicon oxide spacer layer, where the plurality of spacers serve as a mask for the target layer. In some implementations, the second oxidation condition is different from the first oxidation condition by one or more of the following: (1) an oxidation time, (2) an RF power, and (3) a substrate temperature. In some implementations, an upper portion of each of the plurality of silicon oxide spacers has a slope, where the slope is dependent at least in part on the first oxidation condition and the second oxidation condition. In some implementations, the system controller 108 is configured with instructions for ramping at least one of an oxidation time, an RF power, or a substrate temperature over time from the first oxidation condition to the second oxidation condition.

Other computer software and/or programs may be employed in some embodiments. Examples of programs or sections of programs for this purpose include substrate positioning program, a process gas composition control program, a pressure control program, a heater control program, and an RF power supply control program.

In some cases, the system controller 108 controls gas concentration, substrate movement, and/or the power supplied to the coil 134 and/or substrate support 116. The system controller 108 may control the gas concentration by, for example, opening and closing relevant valves to produce one or more inlet gas stream that provide the necessary reactant(s) at the proper concentration(s). The substrate movement may be controlled by, for example, directing a substrate positioning system to move as desired. The power supplied to the coil 134 and/or substrate support 116 may be controlled to provide particular RF power levels. If a grid is used, the RF powers may be adjusted by the system controller 108 to create an electron-ion plasma in an upper portion of the plasma chamber 132 and ion-ion plasma in a lower portion of the plasma chamber 132. Further, the system controller 108 may be configured to supply power to the substrate support 116 under conditions such that an electron-ion plasma does not form in the lower portion of the plasma chamber 132.

The system controller 108 may control these and other aspects based on sensor output (e.g., when power, potential, pressure, etc. reach a certain threshold), the timing of an operation (e.g., opening valves at certain times in a process), or based on received instructions from the user.

In some implementations, a system controller 108 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 108, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the system controller 108 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 108 in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The system controller 108, in some implementations, may be a part of or coupled to a computer that is integrated with, coupled to the system, otherwise networked to the system, or a combination thereof. For example, the system controller 108 may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 108 receives instructions in the form of data, which specify parameters for each of the processing steps to be performed during one or more operations. It should be understood that the parameters may be specific to the type of process to be performed and the type of tool that the system controller 108 is configured to interface with or control. Thus as described above, the system controller 108 may be distributed, such as by comprising one or more discrete controllers that are networked together and working towards a common purpose, such as the processes and controls described herein. An example of a distributed system controller 108 for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the system controller 108 might communicate with one or more of other tool circuits or modules, other tool components, cluster tools, other tool interfaces, adjacent tools, neighboring tools, tools located throughout a factory, a main computer, another system controller 108, or tools used in material transport that bring containers of substrates to and from tool locations and/or load ports in a semiconductor manufacturing factory.

Multiple Patterning

Advancements in technology have increased the demand for shrinking device features and smaller pitches in semiconductor devices. Various patterning techniques and methods have been employed to achieve smaller device features and smaller pitches but often reach certain limits. For example, high-resolution photolithography may be used to print small features to obtain small critical dimensions (CDs), but high-resolution photolithography may not be able to print features beyond a certain limit (e.g., 40 nm or less) and so the pitch may not be more than the limit.

Generally speaking, the resolution achieved using photolithography is dependent on wavelength. Photoresist masks have optical properties dependent on wavelength, with longer wavelength photoresist masks exposed to longer wavelength light having larger theoretical CDs and shorter wavelength masks exposed to shorter wavelength light having smaller theoretical CDs. However, the use of shorter wavelength photoresist masks may present additional challenges over longer wavelength photoresist masks. For example, shorter wavelength photoresist masks may not have a selectivity as high as longer wavelength photoresist masks and may more easily deform under plasma etch conditions. Even if photolithography is optionally combined with a trimming step that produces small features, what is produced may not necessarily have small pitch.

Multiple patterning has been used to extend lithographic technology beyond its optical limits. Double patterning and quad patterning are example technologies used to extend lithographic technology beyond its optical limits and double patterning is now widely used in the industry for pitches less than about 80 nm. For example, if a pitch of about 100 nm from one or more lines is produced, double patterning may shrink the one or more lines, deposit spacers, and etch back the spacers so as to increase the number of lines and double the pitch to about 50 nm. This can be referred to as "pitch doubling," where the increased number of lines can be used as a subsequent mask or hard mask.

Current double patterning technologies often use sidewall spacers with two masking steps to pattern trenches. Methods of double patterning, particularly line patterning, in both positive and negative double patterning processes, have involved the use of spacers and masks. Spacers can be deposited by atomic layer deposition (ALD) or plasma enhanced atomic layer deposition (PEALD) on a patterned core and may be used to create a smaller pitch pattern. As devices shrink and pitch decreases, issues such as spacer leaning, line bending, and patterned spacer collapse arise, which can degrade device performance and even lead to device failure.

Figure 2A:
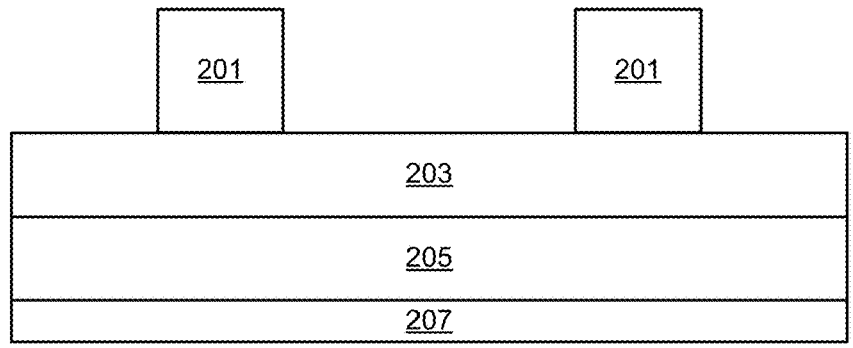
FIGS. 2A-2I are schematic illustrations of substrates in an example multiple patterning scheme according to some implementations.

FIGS. 2A-2I are schematic illustrations of substrates in an example multiple patterning scheme according to some implementations. FIG. 2A shows a substrate having a lithographically defined or patterned core 201 on a first layer 203, a second layer 205 underlying the first layer 203, and a third layer 207 underlying the second layer 205. In some implementations, the first layer 203 may also be referred to as a second core 203, and the second layer 205 may also be referred to as a target layer 205. One of ordinary skill in the art will appreciate that a multi-layer stack suitable for semiconductor processing as described herein may also include other layers, such as etch stop layers, cap layers, and other underlayers.

As shown in FIG. 2A, the patterned core 201 may be a photoresist or may include amorphous carbon or amorphous silicon material. The patterned core 201 may be deposited over the first layer 203 by any suitable deposition technique, such as plasma enhanced chemical vapor deposition (PECVD), and the deposition technique may involve generating a plasma in the deposition chamber from deposition gases such as a hydrocarbon precursor. For example, a hydrocarbon precursor may be defined by the formula $C_xH_y$, where x is an integer between 2 and 10, and y is an integer between 2 and 24. In some implementations, the patterned core 201 may include a core material such as a photoresist. In some implementations, the patterned core 201 may include a core material that is spin-on carbon, diamond-like carbon, or gapfill ashable hard mask. A dual radio frequency (RF) plasma source including a high frequency (HF) and a low frequency (LF) power may be used.

The first layer 203, the second layer 205, or the third layer 207 may be the target layer ultimately to be patterned in the multiple patterning process. The target layer may be a semiconductor, dielectric, or other layer and may be made of silicon (Si), silicon oxide ($SiO_2$), silicon nitride ($Si_3N_4$), or titanium nitride (TiN), for example. The target layer may be deposited by ALD, PEALD, chemical vapor deposition (CVD), or other suitable deposition technique.

Figure 2B:
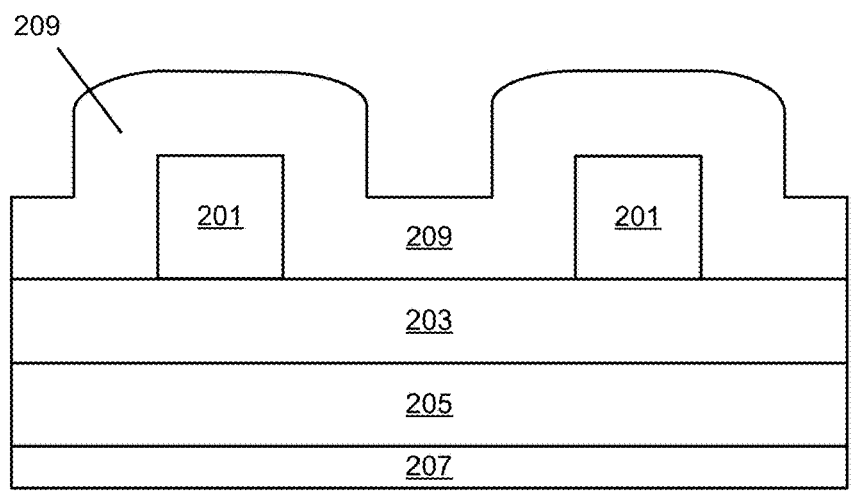
Figure 2C:
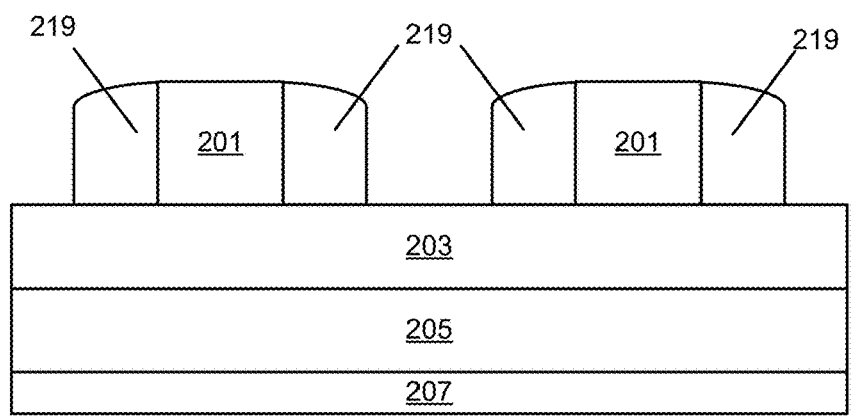
Figure 2D:
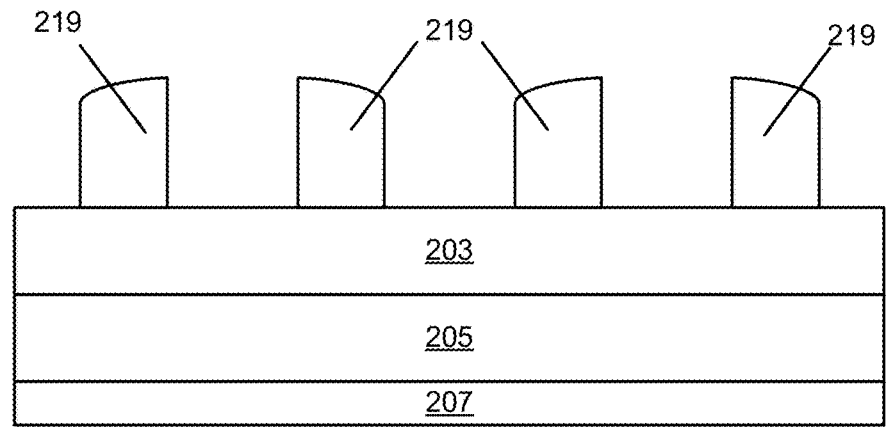

In FIG. 2B, a first conformal film 209 is deposited over the patterned core 201. The first conformal film 209 may be deposited by ALD or PEALD in some implementations. The first conformal film 209 may be directionally etched to form first spacers 219 as shown in FIG. 2C. The first spacers 219 may be an oxide, such as silicon oxide ($SiO_2$) or titanium oxide ($TiO_2$), or may be a nitride, such as silicon nitride ($Si_3N_4$). The pattern of the first spacers 219 is used to pattern subsequent layers. It will be understood that the term "spacer" as used herein means a mask material adjacent to a core material. In FIG. 2D, the patterned core 201 is selectively etched, leaving free-standing first spacers 219 on the substrate. Selective removal or selecting etching as used herein is defined as etching one material selective to another. For example, in FIG. 2D, the patterned core 201 is etched selective to the first spacers 219. It will be understood that in some implementations, if a first material is etched selective to a second material, the etch rate of the first material is faster than the etch rate of the second material such that for a given duration, more of the first material is etched than the second material.

Figure 2E:
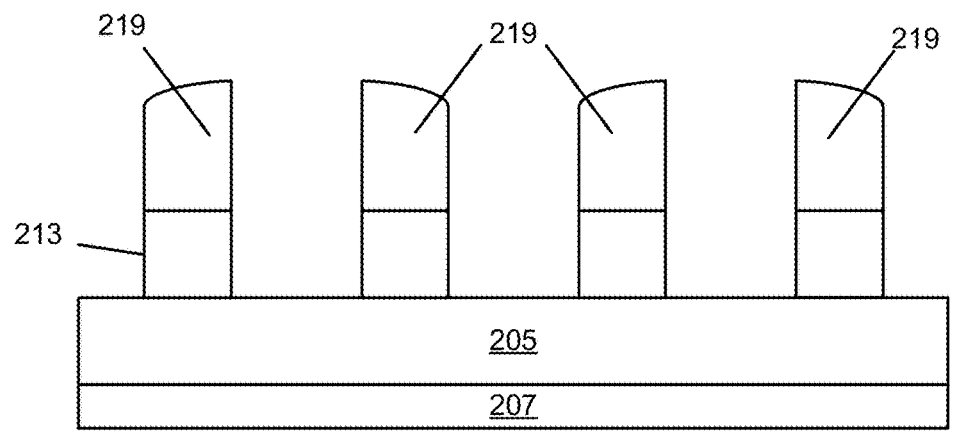
Figure 2F:
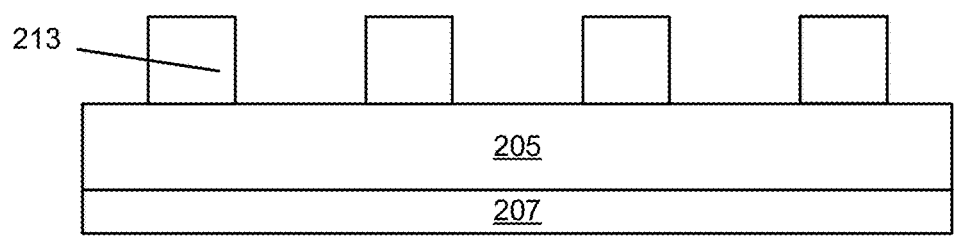
Figure 2G:
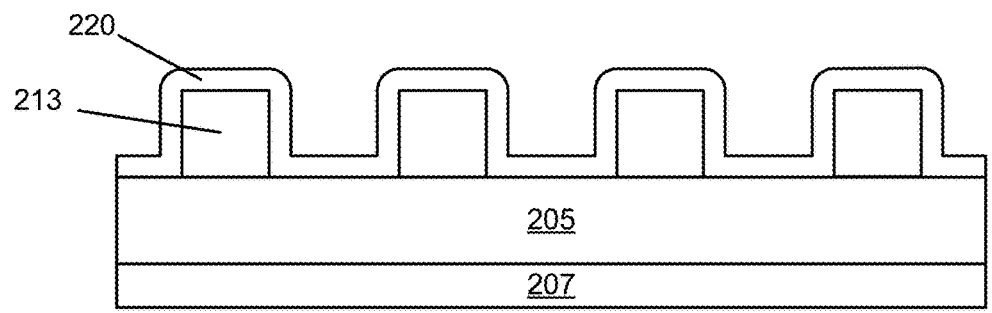
Figure 2H:
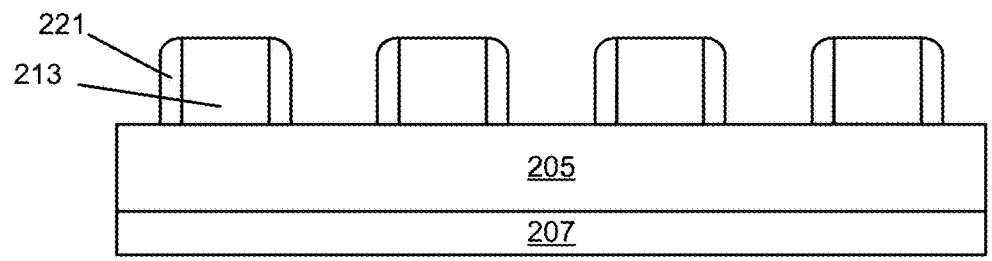
Figure 2I:
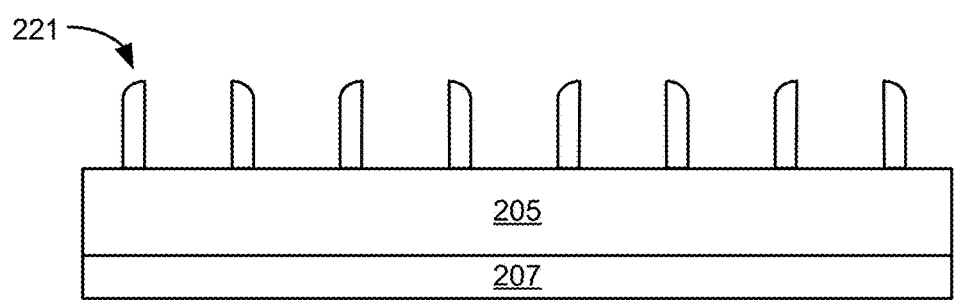

The pattern of the first spacers 219 may have a desired pitch, where the desired pitch may be equal to or less than about 50 nm. In FIG. 2E, the first layer 203 is etched using the patterned first spacers 219 as a mask, thereby transferring the pattern to the first layer 203 to form patterned first layer 213. The patterned first layer 213 may be etched using a chemistry suitable for etching the first layer 203 but not the patterned first spacers 219. In some implementations, the patterned first layer 213 may be an amorphous carbon layer, amorphous silicon layer, or a photoresist, such as poly (methyl methacrylate) or poly(methyl glutarimide) (PMGI) or phenol formaldehyde resin. In FIG. 2F, the first spacers 219 are selectively removed to leave patterned first layer 213. In one example, the first spacers 219 may be removed using a fluorocarbon-based plasma. The patterned first layer 213 may provide a mask with a smaller CD for forming features with a smaller CD. However, the patterned first layer 213 may alternatively provide a second core material for subsequent patterning. In FIG. 2G, a second conformal film 220 may be deposited over the patterned first layer 213 (e.g., second core material). The second conformal film 220 may be a dielectric material deposited by ALD or PEALD. For example, the second conformal film 220 may be silicon oxide. In some implementations, the second conformal film 220 may have the same or similar composition to that of the first conformal film 209. In FIG. 2H, the second conformal film 220 is directionally etched to form second spacers 221 flanking the patterned first layer 213. In FIG. 2I, the patterned first layer 213 is selectively removed to leave free-standing second spacers 221. Here, the patterned first layer 213 may be etched using the same or similar chemistry as etching the patterned core 201 in FIG. 2D. The second spacers 221 may provide a mask with an even smaller CD for forming features with an even smaller pitch.

Current methods and techniques may be insufficient to form spacers (e.g., first spacers 219 and second spacers 221) that can withstand mechanical deformation in multiple subsequent processing steps for removing core material and/or gap fill material between spacers. While alternative materials may be used for spacers, atomic layer deposition processes for silicon oxide ($SiO_2$) material offers a low cost option having high throughput due to inexpensive precursors, and atomic layer deposition processes use fast cycle times. Further, reactors used for depositing silicon oxide are generally easy to clean. However, existing methods and techniques for depositing silicon oxide may not be able to control a slope/profile of silicon oxide spacers, particularly at pitches less than 45 nm.

Following a spacer etch step in FIG. 2C and core material removal in FIG. 2D, a profile of the free-standing first spacers 219 may not be perfectly vertical. The free-standing first spacers 219 may lean, bend, or otherwise slope to the left or right after an etch operation. With a sloped profile, the free-standing first spacers 219 serve as a mask with a sloped profile that transfers to an underlayer, such as the first layer 203. This can in turn result in pattern shift and profile distortion in functional layers after the etch operation. Moreover, this can have an adverse impact on CD and CD uniformity. Likewise, following a spacer etch step in FIG. 2H and core material removal in FIG. 2I, a profile of the free-standing second spacers 221 may not be perfectly vertical. Instead, the free-standing second spacers 221 may be sloped and the pattern of the free-standing second spacers is transferred to an underlayer, such as the second layer 205. This can result in pattern shift and profile distortion in the second layer 205, where the second layer 205 may be the target layer.

Correction of spacer profile in a multiple patterning scheme is challenging and often expensive. Typically, spacer profile correction may occur by correcting a profile of core material and/or by repeated alternating deposition and etch operations (dep-etch-dep) during spacer deposition. A slope of the core material may be controlled during deposition of the core material to obtain a more vertical profile of the core material or to obtain a slightly negative/positive slope to counteract intrinsic stress that develops in a subsequently deposited spacer. This may correct the profile of the spacers. However, controlling the slope of the core material does not sufficiently prevent a sloped profile from forming in the spacers and does not alleviate the intrinsic stress that develops in the spacers. Furthermore, repeated dep-etch-dep operations during spacer deposition may be expensive and time-consuming to correct a profile of the spacers, and typically results in some residual amount of slope after spacer etch and core material removal operations. Repeated dep-etch-dep operations performed in separate chambers may increase processing time, processing steps, and processing costs as well as introduce vacuum breaks in between operations that increase the likelihood of unwanted materials or particles coming into contact with the substrates.

Atomic Layer Deposition

Provided herein are methods, systems, and apparatuses for controlling silicon oxide spacer profile. ALD or PEALD is used for silicon oxide spacer deposition in a multiple patterning scheme. ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. Unlike a CVD technique, ALD processes use surface-self-limited deposition reactions to deposit films on a layer-by-layer basis. A typical ALD cycle may include: (i) dosing that delivers and adsorbs precursor material onto a substrate surface, (ii) purging excess precursor material from the chamber and leaving a self-limited monolayer on the substrate surface, (iii) delivery of reactant material to react with the adsorbed precursor material, and (iv) purging of unreacted reactant material or reaction byproducts from the chamber. The dose step may adsorb precursor material in a self-limiting manner such that once active sites are occupied by the precursor material, little or no additional precursor material will be adsorbed on the substrate surface. The reactant material may likewise react with the precursor material in a self-limiting or absorption-limiting manner. Purge steps may be optionally performed to remove excess precursor material, reaction byproducts, and/or unreacted reactant material from the chamber, completing an ALD cycle. ALD may be used to provide highly conformal films with relatively high step coverage even in high aspect ratio features.

Figure 3:
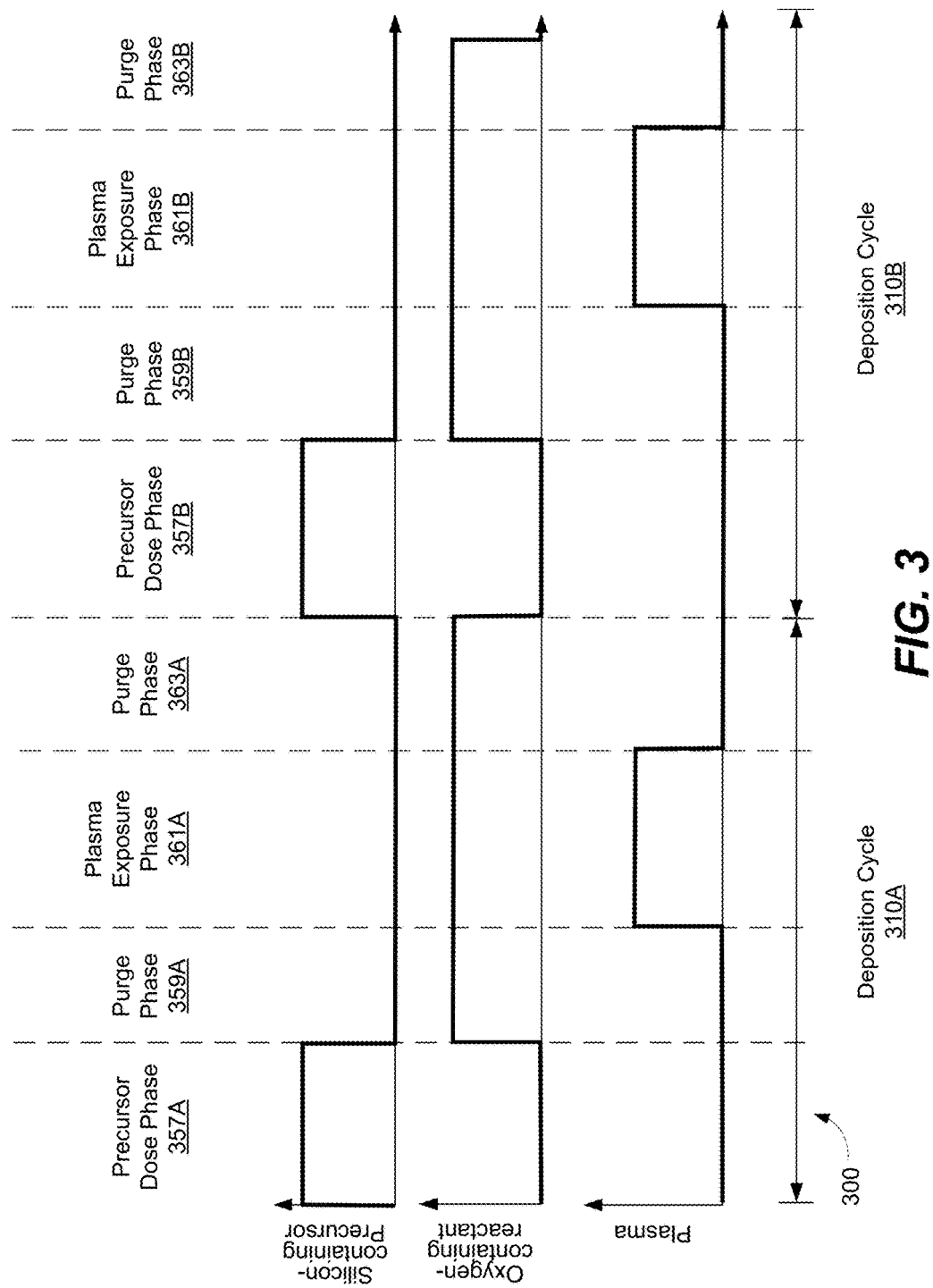
FIG. 3 shows an example timing sequence diagram for multiple ALD cycles when depositing a silicon oxide film.

FIG. 3 shows an example timing sequence diagram for multiple ALD cycles when depositing a silicon oxide film. FIG. 3 shows phases in a typical ALD process 300, for various process parameters, such as plasma, oxygen-containing reactant flow, and silicon-containing precursor flow. Each of the ALD cycles in FIG. 3 may represent a PEALD cycle. The lines indicate when the flow is turned on and off, or when plasma is turned on and off. Example process parameters include but are not limited to flow rates for precursor and reactant species, flow rates for inert gas species, plasma power and frequency, substrate temperature, and process chamber pressure. The example in FIG. 3 is for depositing a silicon oxide film using a silicon-containing precursor and oxygen plasma, where the oxygen plasma can convert an adsorbed precursor layer to form a film on a substrate.

Any suitable number of deposition cycles may be included in an ALD process to deposit a desired thickness of silicon oxide film. The timing sequence in FIG. 3 depicts two deposition cycles, 310A and 310B. Each deposition cycle 310A, 310B includes various phases. For example, during deposition cycle 310A, the substrate is exposed to a silicon-containing precursor during a dose phase 357A, and during deposition cycle 310B, the substrate is exposed to a silicon-containing precursor during a dose phase 357B. A silicon-containing precursor is a single reagent or mixture of reagents used to make a silicon-containing film, where the reagent or reagent mixture contains at least one silicon compound. In some implementations, the silicon-containing precursor may be, for example, a silane, a halosilane, or an aminosilane. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. Examples of halosilanes are iodosilanes, bromosilanes, chlorosilanes, and fluorosilanes, where specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tert-butylamino)silane ($SiH_2(NHC(CH_3)_3)_2$ (BTBAS)), tert-butyl silylcarbamate, $SiH(CH_3)-(N(CH_3)_2)_2$, $SiHCl-(N(CH_3)_2)_2$, $(Si(CH_3)_2NH)_3$ and the like. A further example of an aminosilane is trisilylamine ($N(SiH_3)$). During dose phases 357A and 357B, plasma is turned off and no oxygen-containing reactant is flowed to the substrate. In some implementations, the substrate may be exposed to the silicon-containing precursor for a time between about 0.1 seconds and about 60 seconds, or between about 0.2 seconds and about 6 seconds, depending on the flow rate and the substrate surface area. In some implementations, a carrier gas or inert gas flows during the dose phases 357A and 357B.

In some implementations, the silicon-containing precursor adsorbs onto the substrate surface in a self-limiting manner such that once active sites are occupied by the silicon-containing precursor, little or no additional silicon-containing precursor will be adsorbed on the substrate surface. For example, silicon-containing precursors may be adsorbed onto at least 60% of the substrate surface. When the silicon-containing precursor adsorbs onto active sites on the surface of the substrate, a thin layer of the silicon-containing precursor forms on the surface. In various implementations, this layer may be less than a monolayer, and may have a thickness between about 0.1 Å and about 0.5 Å. Unlike a CVD or CVD-like process, the silicon-containing precursor does not decompose to form a silicon layer.

In purge phases 359A and 359B of deposition cycles 310A and 310B, respectively, a process chamber is optionally purged to remove excess silicon-containing precursor in the vapor phase that did not adsorb onto the surface of the substrate. Purging may involve a sweep gas, which may be a carrier gas used in other operations or a different gas. In some implementations, purging may involve evacuating the process chamber. During purge phases 359A and 359B, silicon-containing precursor flow is turned off and no plasma is ignited. Oxygen-containing reactant may or may not be supplied to the process chamber during purge phases 359A and 359B. In some implementations, a carrier gas may continue to flow to purge any excess silicon-containing precursor from the process chamber. In some implementations, purge phases 359A and 359B may each include one or more evacuation subphases for evacuating the process chamber. Alternatively, it will be understood that each purge phase 359A and 359B may be omitted in some implementations. Each purge phase 359A and 359B may have any suitable duration, such as between about 0 seconds and about 60 seconds, or about 0.01 seconds. In some implementations, increasing a flow rate of one or more sweep gases may decrease the duration of each purge phase 359A and 359B. For example, a purge gas flow rate may be adjusted according to various reactant thermodynamic characteristics and/or geometric characteristics of the process chamber and/or process chamber plumbing for modifying the duration of each purge phase 359A and 359B. In one non-limiting example, the duration of a sweep phase may be adjusted by modulating sweep gas flow rate. This may reduce deposition cycle time, which may improve substrate throughput. After a purge, at least some silicon-containing precursors remain adsorbed on the substrate surface.

A plasma may be ignited during plasma exposure phases 361A and 361B of the deposition cycles 310A and 310B, respectively. For example, the substrate may be exposed to oxygen plasma during plasma exposure phases 361A and 361B. It will be understood that reference to "oxygen plasma" includes plasma of any oxygen-containing reactant described below and is not limited to plasma of pure oxygen gas. Flow of oxygen-containing reactant and plasma are both turned on during the plasma exposure phases 361A and 361B. In some implementations, flow of oxygen-containing reactant may be turned on prior to turning on the plasma. Flow of silicon-containing precursor is turned off during plasma exposure phases 361A and 361B. In some implementations, carrier gas may continue to flow during the plasma exposure phases 361A and 361B. The substrate may be exposed to the plasma of the oxygen-containing reactant for a duration between about 0.1 seconds and about 60 seconds, or between about 0.2 seconds and about 6 seconds. In some implementations, plasma exposure phases 361A and 361B may have a duration that exceeds a time for plasma to interact with all precursors adsorbed on the substrate surface, forming a continuous film atop the substrate surface.

Example oxygen-containing reactants or oxidants include oxygen gas, water, carbon dioxide, carbon monoxide, nitrous oxide, nitric oxide, sulfur oxide, sulfur dioxide, oxygen-containing hydrocarbons, ozone, and combinations thereof. In some implementations, the substrate is exposed to the oxygen-containing reactant and a carrier gas simultaneously while the plasma is ignited. For example, oxygen is introduced along with helium, argon, or a mixture thereof to the substrate while the plasma is ignited.

Plasma energy is provided to activate the oxygen-containing reactant, into ions, radicals, and other activated species, which react with the adsorbed layer of the silicon-containing precursor. For example, the plasma may directly or indirectly activate the oxygen-containing reactant gas phase molecules to form oxygen radicals or ions. Once the oxygen-containing reactant is activated to form oxygen plasma, the radicals and/or ions of the oxygen-containing reactant convert the adsorbed silicon-containing precursor into silicon oxide on the surface of the substrate.

In some implementations, the plasma is an in-situ plasma, such that the plasma is formed directly above the substrate surface in the process chamber. The in-situ plasma may be ignited at a power per substrate area between about 0.2 Watts/cm$^2$ and about 2.1 Watts/cm$^2$. For example, the power may range from about 100 Watts to about 10,000 Watts, or from about 150 Watts to about 6,000 Watts, or from about 600 Watts to about 4000 Watts. For example, plasmas for ALD processes may be generated by applying an RF field to a gas using capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition and conversion process. It will be understood that the RF field may be coupled via any suitable electrodes. In various implementations, a high frequency plasma is used having a frequency of at least about 13.56 MHz, or at least about 27 MHz, or at least about 40 MHz, or at least about 60 MHz. In some implementations, a microwave-based plasma may be used. Non-limiting examples of electrodes include process gas distribution showerheads and substrate support pedestals. It will be understood that plasmas for ALD processes may be formed by one or more suitable methods other than capacitive coupling of an RF field to a gas. In some implementations, the plasma is a remote plasma, such that the oxygen-containing reactant is ignited in a remote plasma generator positioned upstream of the process chamber, then is delivered to the process chamber where the substrate is housed. In some implementations, other types of plasma may be used, such as inductively-coupled plasmas instead of capacitively-coupled plasmas.

In purge phases 363A and 363B of deposition cycles 310A and 310B, respectively, the process chamber is optionally purged to remove reaction byproducts and/or unreacted reactant material from the process chamber. The plasma is extinguished during purge phases 363A and 363B. The silicon-containing precursor flow is turned off and no plasma is ignited. Oxygen-containing reactant may or may not be supplied to the process chamber during purge phases 363A and 363B. In some implementations, the purge may be performed by flowing the carrier gas or any other inert gas.

Performing operations 357A, 359A, 361A, and 363A may constitute an ALD cycle, such as the deposition cycle 310A. If the deposited silicon oxide film is not an adequate thickness or desired thickness, then the ALD cycle may be repeated as shown in the deposition cycle 310B. ALD cycles may be repeated until an adequate or desired thickness of the silicon oxide film is formed.

Spacer Slope Control From Spacer Deposition

Provided herein are methods, systems, and apparatuses for controlling silicon oxide spacer profile. During deposition of the silicon oxide spacer, intrinsic stresses may develop in the spacer. Stress distribution in the silicon oxide spacer may correspond to whether the profile is a positive, negative, or vertical slope after etch and core material removal. Stress distribution may be controlled by controlling one or more deposition parameters during an ALD cycle or throughout multiple ALD cycles. Accordingly, setting or modifying appropriate deposition parameters in the ALD cycles may control a final profile of the silicon oxide spacers in a desired manner. Setting or modifying the appropriate deposition parameters may include setting or modifying oxidation conditions in the ALD cycles.

Figure 4A:
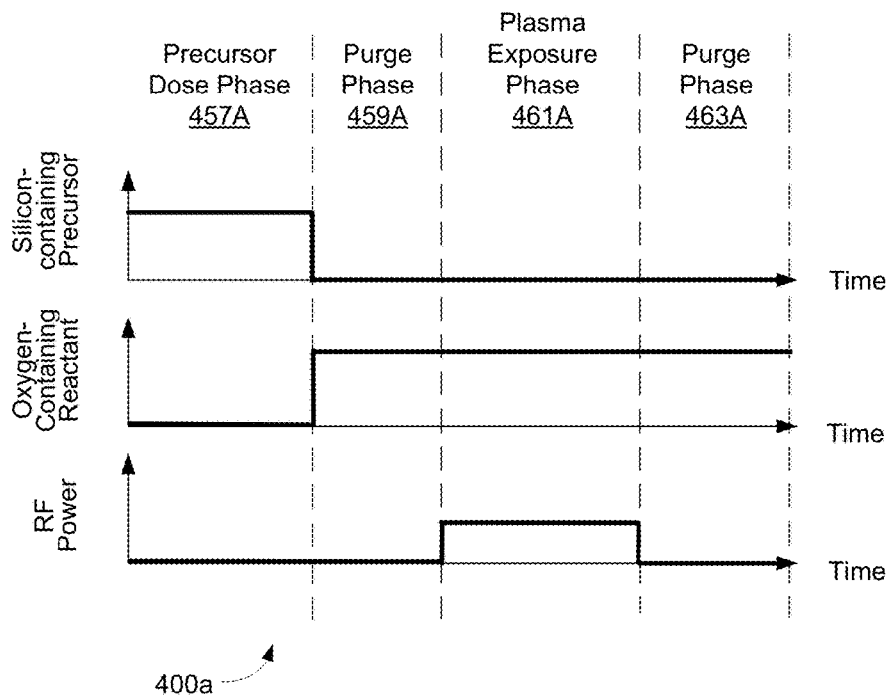
FIG. 4A shows an example timing sequence diagram for a single ALD cycle when depositing a silicon oxide film under a first oxidation condition according to some implementations.
Figure 4B:
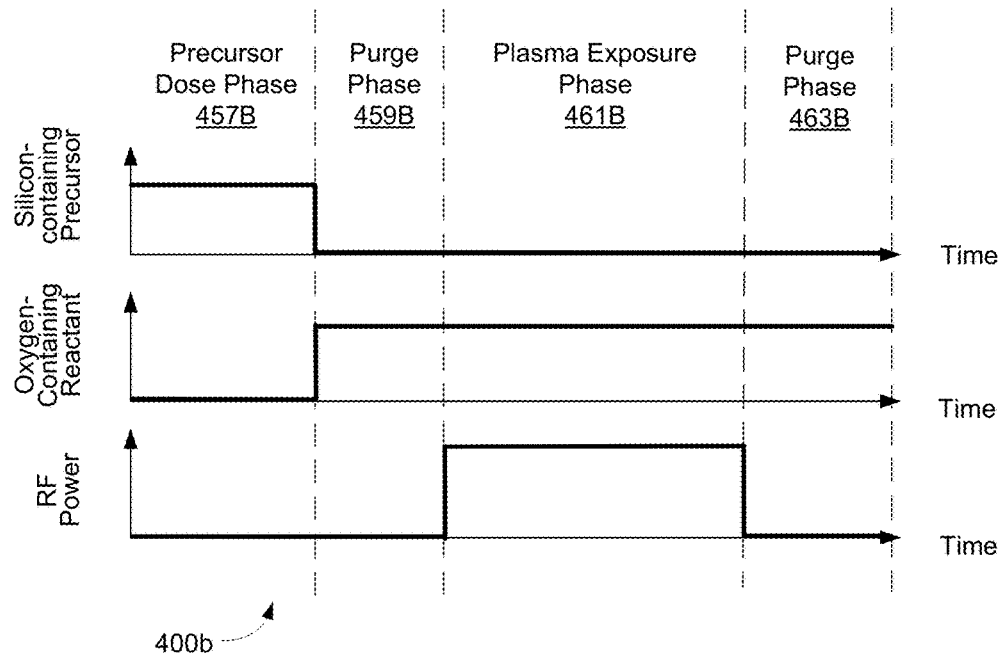
FIG. 4B shows an example timing sequence diagram for a single ALD cycle when depositing a silicon oxide film under a second oxidation condition according to some implementations.

FIG. 4A shows an example timing sequence diagram for a single ALD cycle when depositing a silicon oxide film under a first oxidation condition according to some implementations. FIG. 4B shows an example timing sequence diagram for a single ALD cycle when depositing a silicon oxide film under a second oxidation condition according to some implementations. Each of FIGS. 4A-4B show phases of an ALD cycle across time for various deposition parameters, including RF power, oxygen-containing reactant flow, and silicon-containing precursor flow. The lines indicate when flow is turned on and off, or when plasma is turned on and off. Example process parameters include but are not limited to flow rates for precursor and reactant species, flow rates for inert gas species, plasma power and frequency, substrate temperature, and process chamber pressure. It will be understood that in some implementations, plasma power and/or RF power may also be referred to as transformer coupled plasma (TCP) power. Upon completion of one or more ALD cycles in FIGS. 4A-4B, a silicon oxide film is formed using a silicon-containing precursor and oxygen plasma, where the oxygen plasma can convert an adsorbed precursor layer to form the silicon oxide film on a substrate. In some implementations, the silicon oxide film may form at least part of a silicon oxide spacer in a multiple patterning scheme.

In FIG. 4A, a single ALD cycle 400a for depositing a silicon oxide film includes a precursor dose phase 457A, an optional purge phase 459A, a plasma exposure phase 461A, and an optional purge phase 463A. In FIG. 4B, a single ALD cycle 400*b* for depositing a silicon oxide film includes a precursor dose phase 457B, an optional purge phase 459B, a plasma exposure phase 461B, and an optional purge phase 463B. Details regarding dose phases 357A and 357B, purge phases 359A and 359B, plasma exposure phases 361A and 361B, and purge phases 363A and 363B in FIG. 3 may apply to the dose phases 457A and 457B, the purge phases 459A and 459B, the plasma exposure phases 461A and 461B, and the purge phases 463A and 463B in FIGS. 4A-4B.

Deposition parameters for the ALD cycle 400*a* in FIG. 4A are different from deposition parameters for the ALD cycle 400*b* in FIG. 4B. As illustrated in FIGS. 4A-4B, oxidation conditions of the plasma exposure phase 461A in FIG. 4A are different from oxidation conditions of the plasma exposure phase 461B in FIG. 4B. The plasma exposure phase 461B uses a higher RF power and exposes the substrate for a longer duration than the plasma exposure phase 461A. By way of an example, the plasma exposure phase 461A may expose the substrate to oxygen plasma for a shorter duration of about 0.5 seconds and at a lower RF power of about 500 Watts, whereas the plasma exposure phase 461B may expose the substrate to oxygen plasma for a longer duration of about 1.5 seconds and a higher RF power of about 2500 Watts. Though not shown in FIGS. 4A-4B, a chamber pressure may be reduced during purge phase 459A and plasma exposure phase 461A as well as during purge phase 459B and plasma exposure phase 461B, where the reduced chamber pressure may be between about 10 mTorr and about 100 mTorr. For example, the reduced chamber pressure may be about 30 mTorr. The chamber pressure may influence the quality of the oxide. The different oxidation conditions between the plasma exposure phase 461A and the plasma exposure phase 461B may result in different amounts of stress in each of the deposited silicon oxide films. Without being limited by any theory, the stress distribution in the deposited silicon oxide films corresponds to the profile of a silicon oxide spacer after spacer etch and core material removal. Thus, when a plurality of ALD cycles 400*a* under the first oxidation condition are performed and a plurality of ALD cycles 400*b* under the second oxidation condition are performed, with the plurality of ALD cycles 400*a* and the plurality of ALD cycles 400*b* being performed according to specified sequences, the specified sequences produce different profiles in the deposited silicon oxide spacers. For example, applying a plurality of ALD cycles 400*a* under the first oxidation condition in FIG. 4A followed by applying a plurality of ALD cycles 400*b* under the second oxidation condition in FIG. 4B results in silicon oxide spacers with a positive slope after spacer etch and core material removal. Alternatively, applying a plurality of ALD cycles 400*b* under the second oxidation condition in FIG. 4B followed by applying a plurality of ALD cycles 400*a* under the first oxidation condition in FIG. 4A results in silicon oxide spacers with a negative slope after spacer etch and core material removal. The number of cycles and the sequence of cycles between ALD cycles 400*a* and ALD cycles 400*b* may determine the slope of silicon oxide spacers after spacer etch and core material removal.

Figure 5:
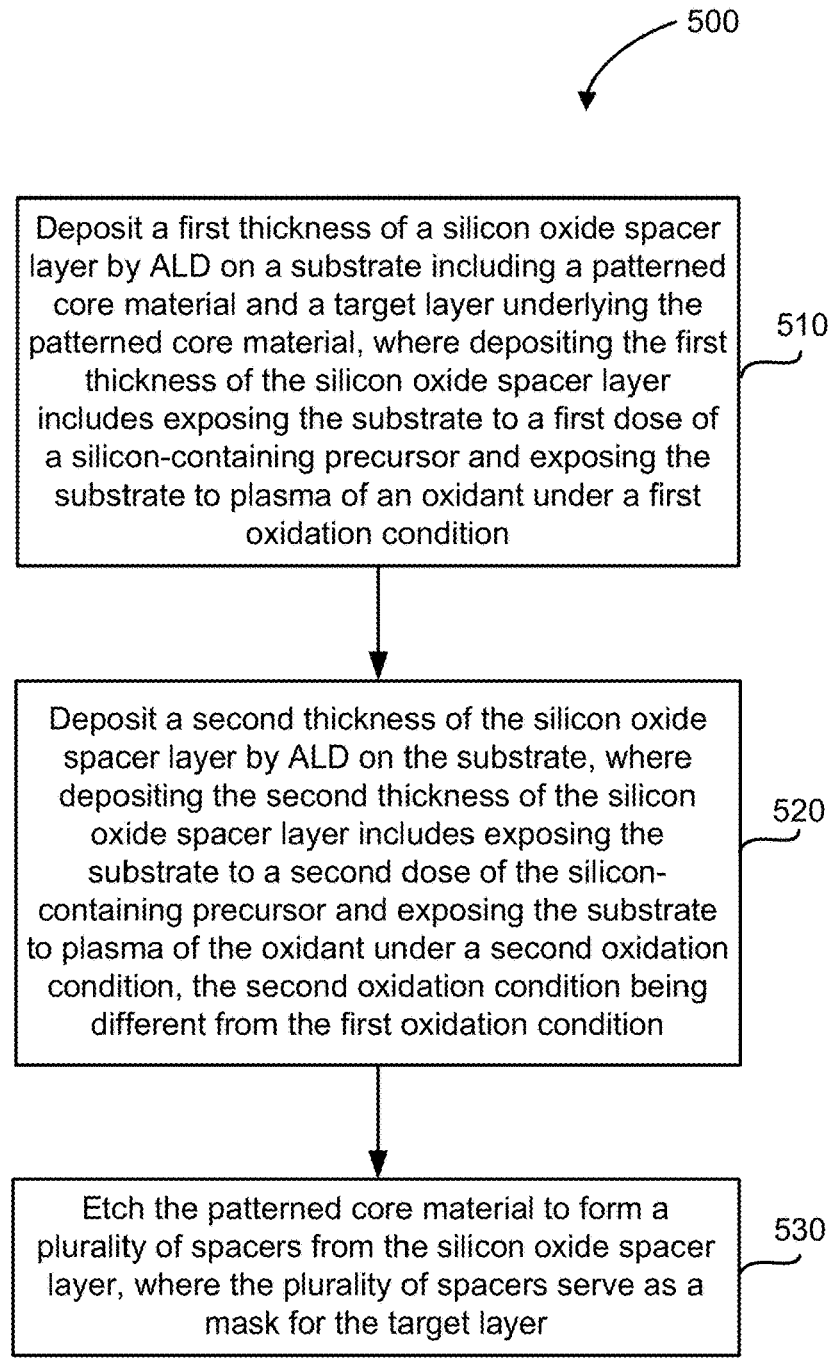
FIG. 5 shows a flow diagram of an example method for forming a plurality of silicon oxide spacers by ALD and etch according to some implementations.

FIG. 5 shows a flow diagram of an example method for forming a plurality of silicon oxide spacers by ALD and etch according to some implementations. The operations in a process 500 may be performed in different orders and/or with different, fewer, or additional operations. FIG. 5 is described with reference to FIGS. 6A-6D, 7A-7D, and 8A-8D. FIGS. 6A-6D are schematic illustrations of various stages for forming a plurality of silicon oxide spacers having a profile with a positive slope according to some implementations. FIGS. 7A-7D are schematic illustrations of various stages for forming a plurality of silicon oxide spacers having a profile with a negative slope according to some implementations. FIGS. 8A-8D are schematic illustrations of various stages for forming a plurality of silicon oxide spacers having a vertical profile according to some implementations.

Prior to block 510 of the process 500, the process 500 may optionally include providing a substrate having a patterned core material and a target layer. The patterned core material may be a photoresist or may be made of amorphous carbon or amorphous silicon material. In some implementations, the patterned core material is spin-on carbon, diamond-like carbon, or gapfill ashable hard mask. The core material may be deposited by any suitable deposition technique such as CVD or PECVD, where the core material may be deposited over the target layer prior to being patterned. In some implementations, the core material may be patterned using a conventional lithography technique. A space CD of the patterned core material may be equal to or greater than about 45 nm. The target layer may be the layer ultimately patterned or at least patterned subsequent to patterning the core material. The target layer may include a semiconductor material, a dielectric material, or a conductive material. Example materials in the target layer may include silicon, silicon nitride, or titanium nitride. The target layer may be deposited by any suitable deposition technique such as ALD, PEALD, CVD, or PECVD.

The substrate may undergo a multiple patterning process to pattern the target layer, where the process 500 includes operations that are at least part of the multiple patterning process. The target layer may be patterned using a patterned mask layer. In some implementations, a plurality of patterned spacers may form the patterned mask layer or transfer its pattern to the patterned mask layer. The plurality of patterned spacers may be formed after spacer etch and core material removal, where core material removal may occur at block 530 of the process 500. A space CD of the plurality of patterned spacers may be equal to or less than about 45 nm.

Figure 6A:
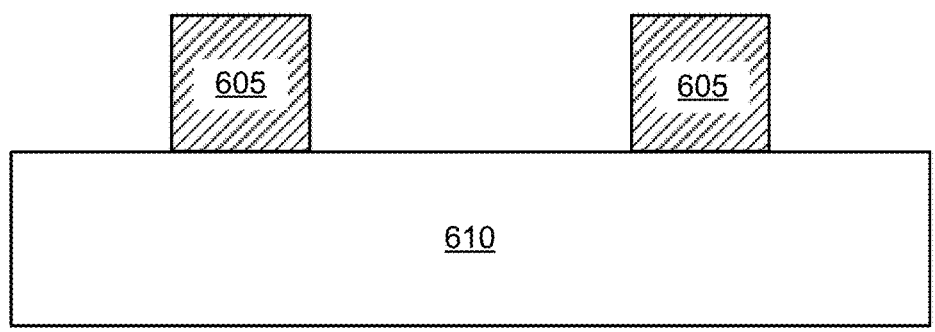
FIGS. 6A-6D are schematic illustrations of various stages for forming a plurality of silicon oxide spacers having a profile with a positive slope according to some implementations.
Figure 7A:
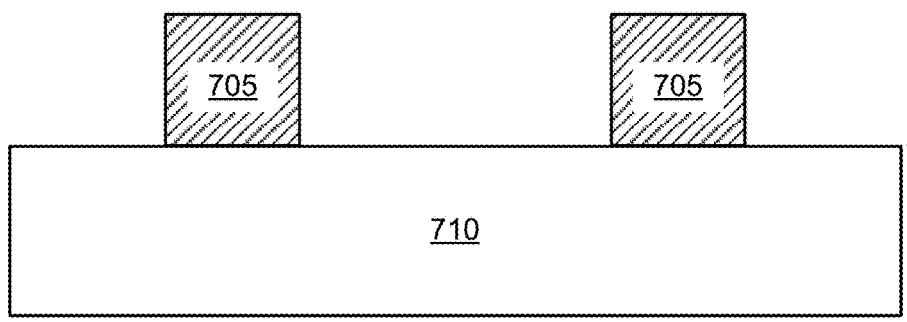
FIGS. 7A-7D are schematic illustrations of various stages for forming a plurality of silicon oxide spacers having a profile with a negative slope according to some implementations.
Figure 8A:
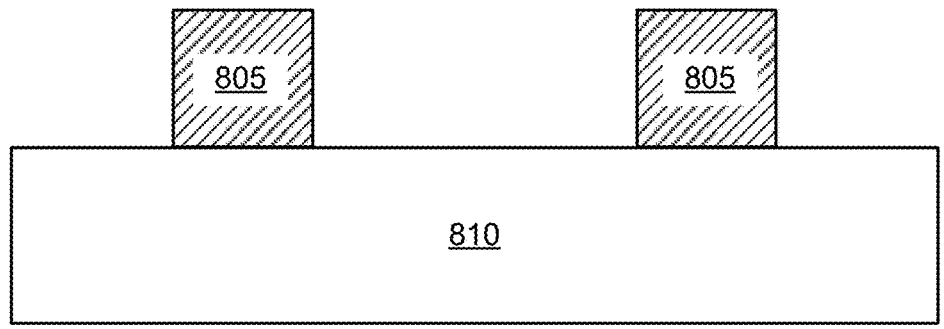
FIGS. 8A-8D are schematic illustrations of various stages for forming a plurality of silicon oxide spacers having a vertical profile according to some implementations.

FIG. 6A shows a schematic illustration of a substrate including a patterned core material 605 and an underlying target layer 610. FIG. 7A shows a schematic illustration of a substrate including a patterned core material 705 and an underlying target layer 710. FIG. 8A shows a schematic illustration of a substrate including a patterned core material 805 and an underlying target layer 810. FIGS. 6A, 7A, and 8A depict substrates prior to depositing a silicon oxide spacer layer.

Returning to FIG. 5, at block 510 of the process 500, a first thickness of a silicon oxide spacer layer is deposited by ALD on the substrate including the patterned core material and the target layer underlying the patterned core material. Depositing the first thickness of the silicon oxide spacer layer includes exposing the substrate to a first dose of a silicon-containing precursor and exposing the substrate to plasma of an oxidant under a first oxidation condition. Depositing the first thickness of the silicon oxide spacer layer includes repeated and multiple cycles of ALD, where each cycle of ALD includes one or more phases as shown in FIGS. 3 and 4A-4B. As an example, the ALD cycle may include: (i) a dose step; (ii) a purge step; (iii) a plasma exposure step; and (iv) a purge step. The dose step may include exposing the substrate to the first dose of the silicon-containing precursor to adsorb the silicon-containing precursor in a self-limiting manner on the substrate surface. This step may also be referred to as "soaking" the substrate surface to saturation. The plasma exposure step may include exposing the substrate to plasma of the oxidant (e.g., oxygen plasma) under the first oxidation condition so that radicals or other charged species of the oxidant react with the silicon-containing precursor to convert the silicon-containing precursor to an adsorption-limited amount of oxide material. The plasma exposure step may also be referred to as a plasma "conversion" step. In some implementations, the oxidant is an oxygen-containing reactant that may include but is not limited to oxygen gas, water, carbon dioxide, carbon monoxide, nitrous oxide, nitric oxide, sulfur oxide, sulfur dioxide, oxygen-containing hydrocarbons, ozone, and combinations thereof. In some implementations, the oxidant is oxygen gas. The oxidant may be exposed to RF power delivery in a relatively short amount of time. For example, the oxidant is exposed to RF power delivery in a time span between about 0.25 seconds and about 5 seconds to form oxygen plasma and convert the silicon-containing precursor. This step may also be referred to as a "flash" operation to convert precursor material on the substrate surface using plasma from RF power delivered in a relatively short amount of time. Thus, exposing the substrate to plasma of the oxidant under the first oxidation conditions includes converting the silicon-containing precursor to form the first thickness of the silicon oxide spacer layer. The ALD cycle, including the dose step and the plasma exposure step, may be repeated until the first thickness of the silicon oxide spacer layer is deposited.

The plasma exposure step may be performed under the first oxidation condition. The first oxidation condition may be characterized by one or more of an oxidation time, RF power delivery, substrate temperature, and chamber pressure. Changes in any of these characteristics or features of the first oxidation condition may affect the stress distribution in the deposited silicon oxide spacer layer, which in turn may affect the resulting profile of a silicon oxide spacer after spacer etch and core material removal. In some implementations, the first oxidation condition can include a first oxidation time between about 0.25 seconds and about 5 seconds, a first RF power between about 100 Watts and about 10,000 Watts, a first substrate temperature between about 0° C. and about 100° C., and a first chamber pressure between about 10 mTorr and about 100 mTorr. In some implementations, the first oxidation condition may have a short oxidation time and a low RF power, where a short oxidation time may be between about 0.25 seconds and about 1.5 seconds and a low RF power may be between about 100 Watts and about 2,500 Watts. In some implementations, the first oxidation condition may have a long oxidation time and a high RF power, where the long oxidation time may be between about 1 second and about 3 seconds and the high RF power may be between about 1,000 Watts and about 5,000 Watts.

Deposition of the first thickness of the silicon oxide spacer layer may be performed in a plasma chamber or plasma etch chamber as described in the processing apparatus 100 of FIG. 1. Various etch operations and deposition operations may be performed in the same plasma chamber without introducing a vacuum break in between operations.

Figure 6B:
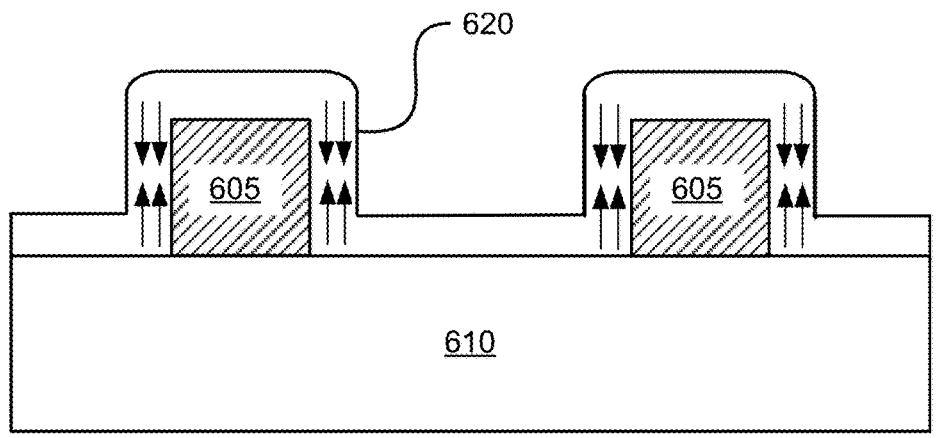

FIG. 6B shows a schematic illustration of a substrate including a first thickness 620 of a silicon oxide spacer layer deposited conformally on exposed surfaces of the patterned core material 605 and the target layer 610. The first thickness 620 may be deposited by multiple ALD cycles, where oxidation conditions during a plasma exposure step result in high amounts of compressive stress in the first thickness 620 of the silicon oxide spacer layer. For example, the oxidation condition may have a short oxidation time and a low RF power delivery to produce a high amount of compressive stress in the layer. In some implementations, the first thickness 620 may be deposited at a relatively low substrate temperature to produce a high amount of compressive stress in the layer.

Figure 7B:
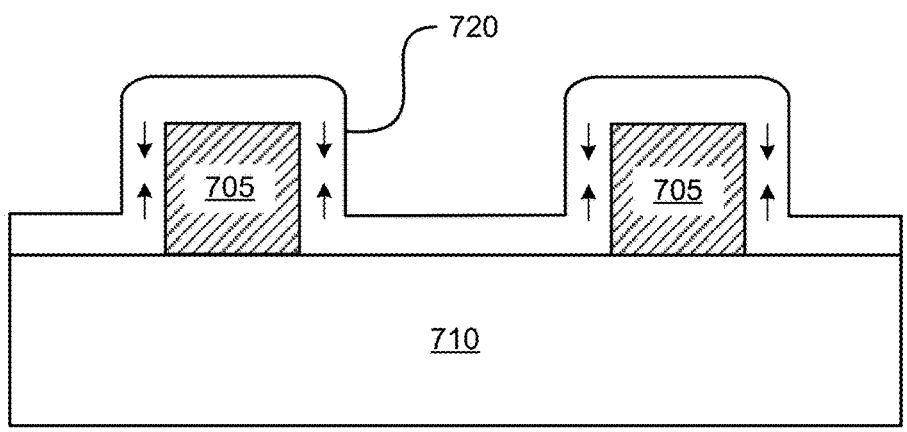

FIG. 7B shows a schematic illustration of a substrate including a first thickness 720 of a silicon oxide spacer layer deposited conformally on exposed surfaces of the patterned core material 705 and the target layer 710. The first thickness 720 may be deposited by multiple ALD cycles, where oxidation conditions during a plasma exposure step result in low amounts of compressive stress in the first thickness 720 of the silicon oxide spacer layer. For example, the oxidation condition may have a long oxidation time and a high RF power delivery to produce a low amount of compressive stress in the layer. In some implementations, the first thickness 720 may be deposited at a relatively high substrate temperature to produce a low amount of compressive stress in the layer.

Figure 8B:
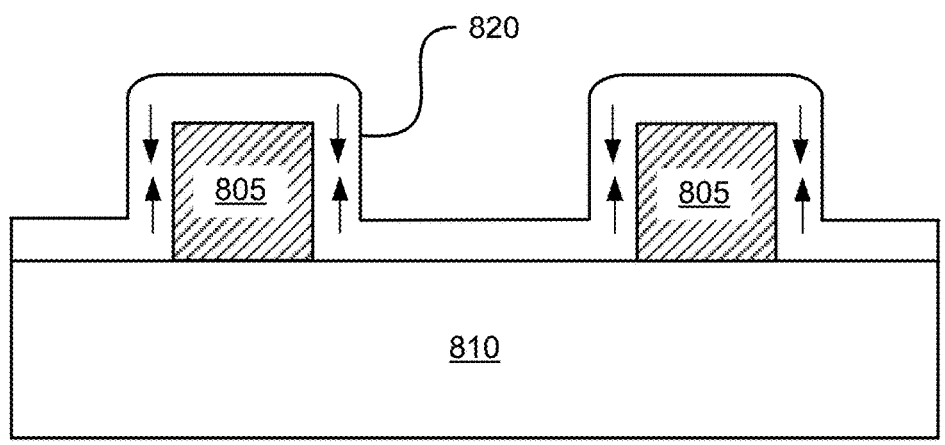

FIG. 8B shows a schematic illustration of a substrate including a first thickness 820 of a silicon oxide spacer layer deposited conformally on exposed surfaces of the patterned core material 805 and the target layer 810. The first thickness 820 may be deposited by multiple ALD cycles, where oxidation conditions during a plasma exposure step result in moderate amounts of compressive stress in the first thickness 820 of the silicon oxide spacer layer. In some implementations, the oxidation condition may have an optimized oxidation time and an optimized RF power delivery to produce a moderate amount of compressive stress in the layer. For example, the optimized oxidation time may be about 1.5 seconds and the optimized RF power may be about 2,500 Watts. In some implementations, the first thickness 820 may be deposited at an optimized substrate temperature to produce a moderate amount of compressive stress in the layer. For example, the substrate temperature may be about 60° C.

Returning to FIG. 5, at block 520 of the process 500, a second thickness of the silicon oxide spacer layer is deposited by ALD on the substrate. Depositing the second thickness of the silicon oxide spacer layer includes exposing the substrate to a second dose of the silicon-containing precursor and exposing the substrate to plasma of the oxidant under a second oxidation condition, where the second oxidation condition is different from the first oxidation condition. Depositing the second thickness of the silicon oxide spacer layer includes repeated and multiple cycles of ALD, where each cycle of ALD may include: (i) a dose step; (ii) a purge step, (iii) a plasma exposure step; and (iv) a purge step, where the aforementioned steps are described above. The dose steps during block 520 may use the same silicon-containing precursor as the dose steps during block 510. The plasma exposure steps during block 520 may use the same oxidant as the plasma exposure steps during block 510. Exposing the substrate to plasma of the oxidant under the second oxidation condition includes converting the second dose of the silicon-containing precursor to form the second thickness of the silicon oxide spacer layer. The composition of the second thickness may be the same as the first thickness of the silicon oxide spacer layer. The ALD cycle, including the dose step and the plasma exposure step, may be repeated until the second thickness of the silicon oxide spacer layer is deposited. The layer formed after block 520 is not necessarily a bilayer of different materials, but a silicon oxide layer formed under two or more different deposition conditions.

The plasma exposure step may be performed under the second oxidation condition. The second oxidation condition may be characterized by one or more of an oxidation time, RF power delivery, substrate temperature, and chamber pressure. In some implementations, the second oxidation condition can include a second oxidation time between about 0.25 seconds and about 5 seconds, a second RF power between about 100 Watts and about 10,000 Watts, a second substrate temperature between about 0° C. and about 100° C., and a second chamber pressure between about 10 mTorr and about 100 mTorr. In some implementations, the second oxidation condition is different from the first oxidation condition by one or more of the following: (1) an oxidation time, (2) an RF power, and (3) a substrate temperature. In some implementations, the second oxidation condition may have a longer oxidation time and a higher RF power than the first oxidation condition. For example, the longer oxidation time may be between about 1 second and about 3 seconds and the higher RF power may be between about 1,000 Watts and about 5,000 Watts. In some implementations, the second oxidation condition may have a shorter oxidation time and a lower RF power than the first oxidation condition. For example, the shorter oxidation time may be between about 0.25 seconds and about 1.5 seconds and the lower RF power may be between about 100 Watts and about 2,500 Watts.

In some implementations, the second oxidation condition may have a substrate temperature different from a substrate temperature of the first oxidation condition. In one example, the second oxidation condition may have a relatively high substrate temperature, where the substrate temperature is between about 40° C. and about 100° C. (e.g., 70° C.), and the first oxidation condition may have a relatively low substrate temperature, where the substrate temperature is between about 0° C. and about 40° C. (e.g., 10° C.). In another example, the second oxidation condition may have a relatively low substrate temperature, where the substrate temperature is between about 0° C. and about 40° C. (e.g., 10° C.), and the first oxidation condition may have a relatively high substrate temperature, where the substrate temperature is between about 40° C. and about 100° C. (e.g., 70° C.). It will be understood that the substrate temperature is not limited to strictly the substrate temperature during the plasma exposure or oxidation phase of an ALD cycle, but the substrate temperature may apply to all of the phases of the ALD cycle. In some implementations, substrate temperature may be ramped from a first substrate temperature of the first oxidation condition to a second substrate temperature of the second oxidation condition. The ramping permits a gradual increase or decrease in substrate temperature from a beginning of the ALD cycles at block 510 to an end of the ALD cycles at block 520. That way, substrate temperature is not necessarily divided into two regimes, but may continuously and gradually change during the deposition of the silicon oxide spacer layer. In some implementations, substrate temperature may continuously and gradually change after each ALD cycle or at a predetermined rate. Substrate temperature may be understood as the temperature at which a substrate support holding the substrate is set to during the deposition operations.

Deposition of the second thickness of the silicon oxide spacer layer may be performed in a plasma chamber or plasma etch chamber as described in the processing apparatus 100 of FIG. 1. Accordingly, the deposition operations at blocks 510 and 520 may be performed in the same plasma chamber without introducing a vacuum break in between operations.

Figure 6C:
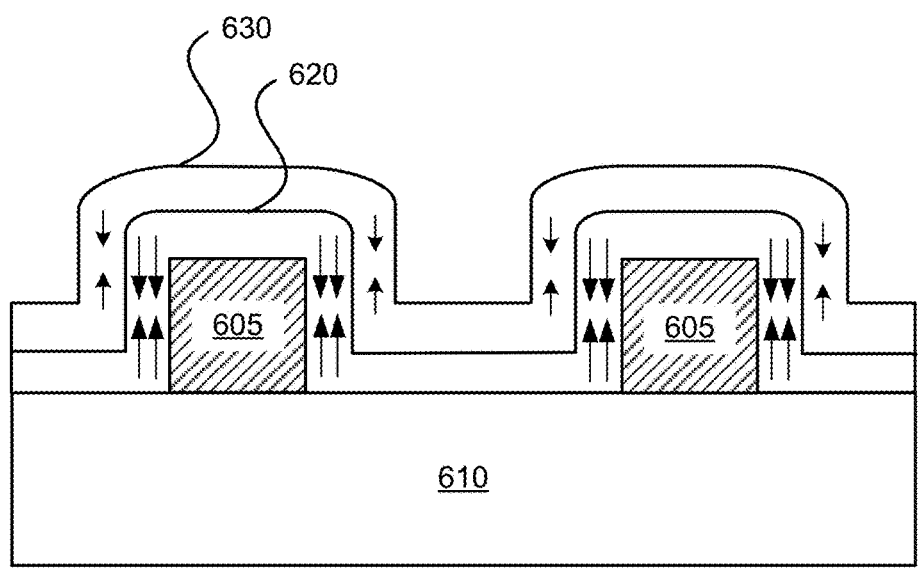

FIG. 6C shows a schematic illustration of a substrate including a second thickness 630 of a silicon oxide spacer layer deposited conformally on a first thickness 620 of the silicon oxide spacer layer, where the substrate includes a patterned core material 605 and an underlying target layer 610. The second thickness 630 may be deposited by multiple ALD cycles, where oxidation conditions during a plasma exposure step result in low amounts of compressive stress in the second thickness 630 of the silicon oxide spacer layer. For example, the oxidation condition may have a long oxidation time and a high RF power delivery to produce a low amount of compressive stress in the layer. In some implementations, the second thickness 630 may be deposited at a relatively high substrate temperature to produce a low amount of compressive stress in the layer.

Figure 7C:
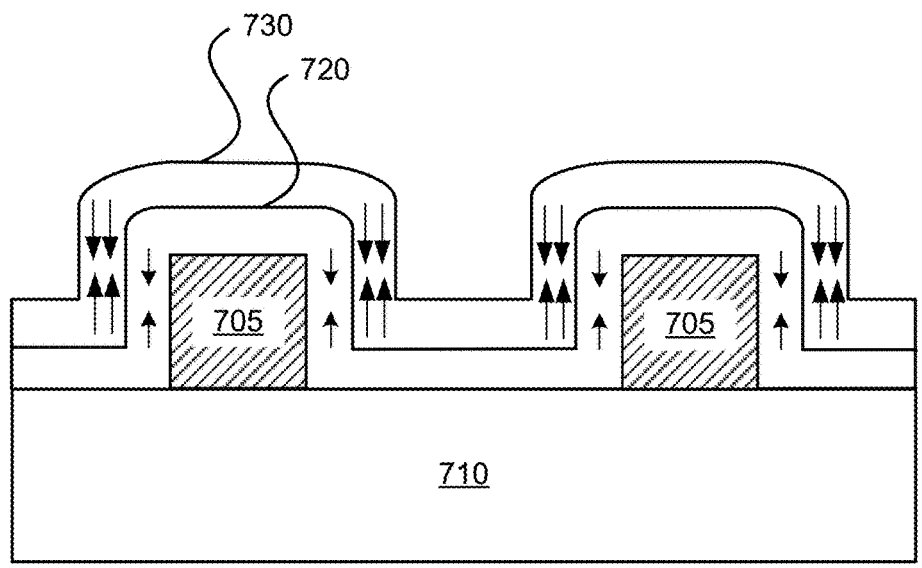

FIG. 7C shows a schematic illustration of a substrate including a second thickness 730 of a silicon oxide spacer layer deposited conformally on a first thickness 720 of the silicon oxide spacer layer, where the substrate includes a patterned core material 705 and an underlying target layer 710. The second thickness 730 may be deposited by multiple ALD cycles, where oxidation conditions during a plasma exposure step result in high amounts of compressive stress in the second thickness 730 of the silicon oxide spacer layer. For example, the oxidation condition may have a short oxidation time and a low RF power delivery to produce a high amount of compressive stress in the layer. In some implementations, the second thickness 730 may be deposited at a relatively low substrate temperature to produce a high amount of compressive stress in the layer.

Figure 8C:
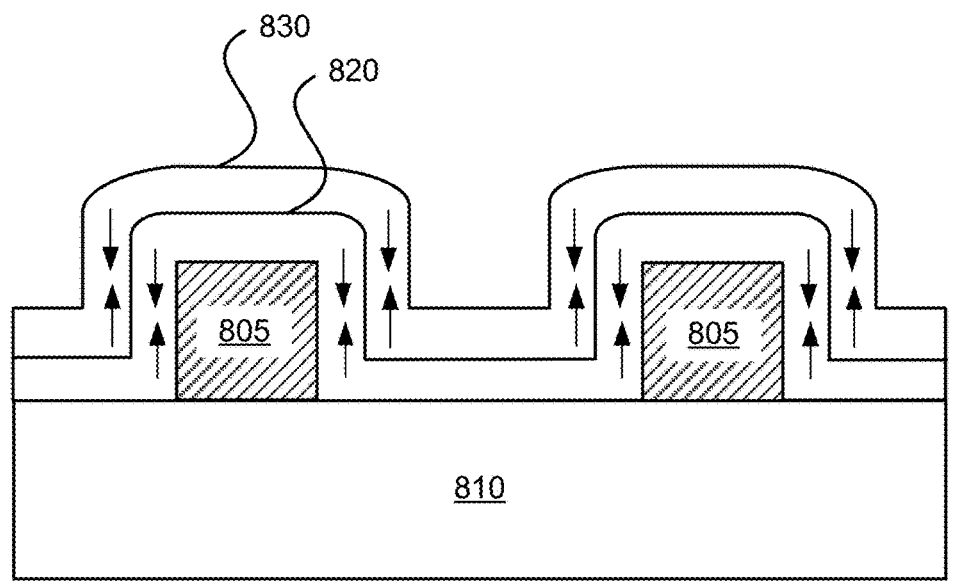

FIG. 8C shows a schematic illustration of a substrate including a second thickness 830 of a silicon oxide spacer layer deposited conformally on a first thickness 820 of the silicon oxide spacer layer, where the substrate includes a patterned core material 805 and an underlying target layer 810. The second thickness 830 may be deposited by multiple ALD cycles, where oxidation conditions during a plasma exposure step result in moderate amounts of compressive stress in the second thickness 830 of the silicon oxide spacer layer. Such oxidation conditions for the second thickness 830 may produce slightly greater amounts of compressive stress in the second thickness 830 than the first thickness 820 of the silicon oxide spacer layer. In some implementations, the oxidation condition may have an optimized oxidation time and an optimized RF power delivery to produce a slightly greater amount of compressive stress in the second thickness 830 than the first thickness 820. For example, the oxidation time may be about 1 second and the RF power may be about 2,000 Watts. In some implementations, the second thickness 830 may be deposited at an optimized substrate temperature to produce a moderate amount of compressive stress in the layer. For example, the substrate temperature may be about 60° C.

Returning to FIG. 5, at block 530 of the process 500, the patterned core material is etched to form a plurality of spacers from the silicon oxide spacer layer, where the plurality of spacers serve as a mask for the target layer. The patterned core material is selectively etched to form the mask, where the mask is a mask of patterned spacers. The deposited silicon oxide spacer layer is adjacent to the patterned core material. The patterned core material may be removed so that a remainder of the deposited silicon oxide spacer layer forms a plurality of spacers, the plurality of spacers being made from the deposited silicon oxide spacer layer. This step may also be referred to as "patterned core removal" or "patterned core strip." An upper portion of each of the plurality of spacers has a slope, where the slope is dependent at least in part on the first oxidation condition when depositing the first thickness of the silicon oxide spacer layer and the second oxidation condition when depositing the second thickness of the silicon oxide spacer layer. After etching the patterned core material, the slope of the spacers may be positive, negative, or vertical.

In some implementations of the process 500, and prior to etching the patterned core material at block 530, a portion of the silicon oxide spacer layer may be etched to define the plurality of spacers. The portion of the silicon oxide spacer layer may be directionally etched so that the remainder of the silicon oxide spacer layer is disposed along sidewalls of the patterned core material. This step may also be referred to as "spacer etch." In some implementations, the directional etch may be performed using a fluorocarbon plasma. After the patterned core material is removed at block 530, the remainder of the silicon oxide spacer layer forms freestanding spacers that serve as a mask for the target layer. After spacer etch and patterned core removal at block 530, the slope of the spacers may be positive, negative, or vertical depending at least in part on the first oxidation condition when depositing the first thickness of the silicon oxide spacer layer and the second oxidation condition when depositing the second thickness of the silicon oxide spacer layer. It will be understood that other factors may contribute to the slope of the spacers, such as the material of the patterned core material.

Etching the patterned core material may be performed in a plasma chamber or plasma etch chamber as described in the processing apparatus 100 of FIG. 1. Accordingly, etching the patterned core material at block 530 may be performed in the same plasma chamber as the deposition operations at blocks 510 and 520. In some implementations, etching the patterned core material at block 530 may be performed in the same plasma chamber as the deposition operations at blocks 510 and 520 without introducing a vacuum break in between operations. In some implementations, the etching of the portion of the silicon oxide spacer layer prior to etching the patterned core material may be performed in the same plasma chamber as the deposition operations at blocks 510 and 520.

The use of separate chambers for deposition and etch increases processing time, processing steps, and costs, thereby having an adverse impact on throughput. Furthermore, the use of separate chambers requires transporting substrates from one chamber to another chamber, which entails vacuum breaks and increases the likelihood of unwanted materials or particles coming into contact with the substrates. This may result in the loss of material functionality and/or integrity on the substrate. Moreover, a clean process is generally required between etch and deposition processes, where the clean process can affect material properties and structure on the substrate. For example, a dilute hydrofluoric (HF) acid clean process has an impact on mask structures and can adversely impact performance. By having deposition and etch operations performed in the same plasma chamber in the process 500, standalone ALD tools and additional cleaning tools are eliminated. Furthermore, processing time and costs are reduced by eliminating additional substrate transfers and clean time. In addition, integrating etch and ALD operations avoids vacuum breaks between substrate transfers (e.g., between ex-situ deposition and clean), which may expose the substrate to unwanted materials, atmosphere, and/or moisture. Integrating etch and ALD operations also reduces the impact of non-uniform deposition across structures or features of different aspect ratios.

Figure 6D:
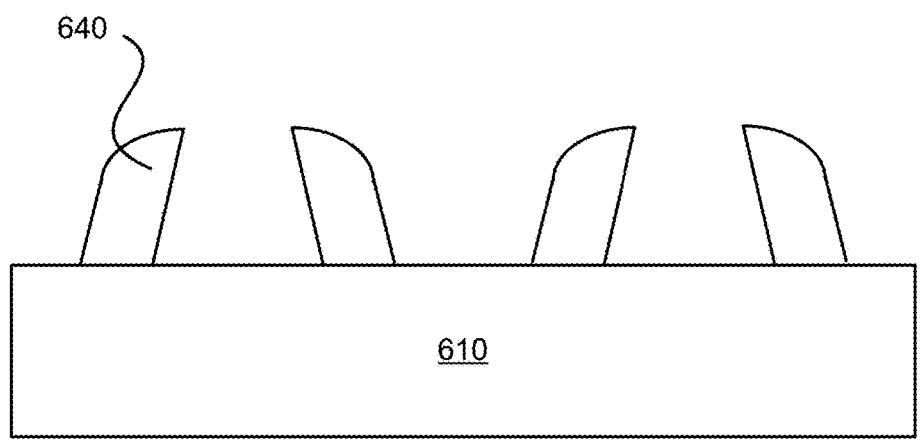

FIG. 6D shows a schematic illustration of a plurality of patterned silicon oxide spacers 640 after a first thickness 620 and a second thickness 630 of a silicon oxide spacer layer are directionally etched and after a patterned core material 605 is removed, where the plurality of patterned silicon oxide spacers 640 have a positive slope. Without being limited by any theory, the stress distribution of having a high amount of compressive stress in the first thickness 620 and a low amount of compressive stress in the second thickness 630 in the silicon oxide spacer layer results in positively sloped spacers 640 after spacer etch and patterned core removal.

Figure 7D:
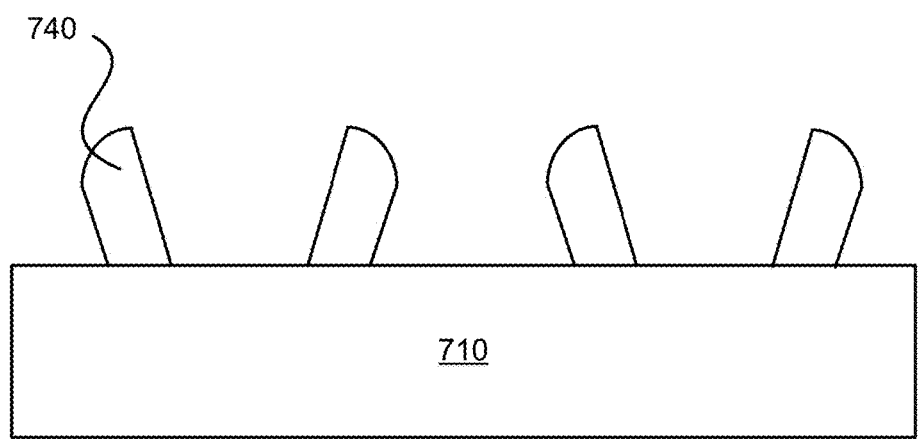

FIG. 7D shows a schematic illustration of a plurality of patterned silicon oxide spacers 740 after a first thickness 720 and a second thickness 730 of a silicon oxide spacer layer are directionally etched and after a patterned core material 705 is removed, where the plurality of patterned silicon oxide spacers 740 have a negative slope. Without being limited by any theory, the stress distribution of having a low amount of compressive stress in the first thickness 720 and a high amount of compressive stress in the second thickness 730 in the silicon oxide spacer layer results in negatively sloped spacers 740 after spacer etch and patterned core removal.

Figure 8D:
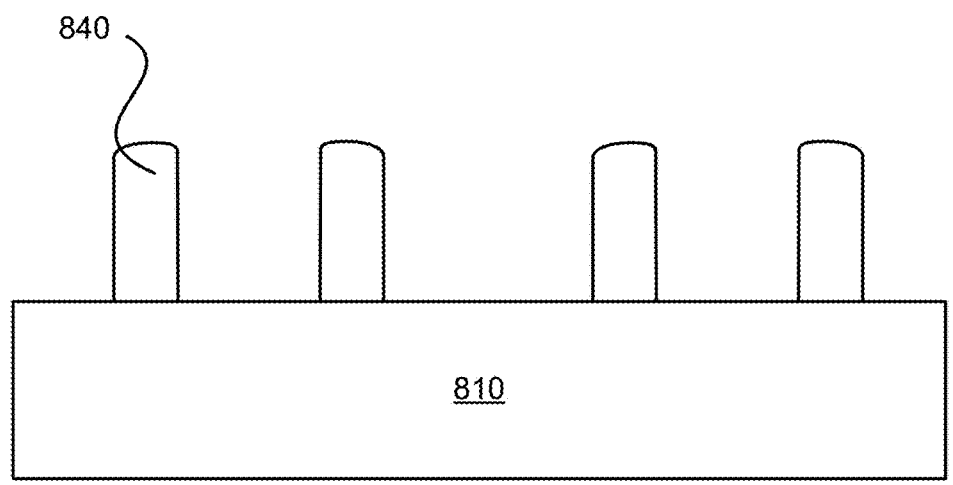

FIG. 8D shows a schematic illustration of a plurality of patterned silicon oxide spacers 840 after a first thickness 820 and a second thickness 830 of a silicon oxide spacer layer are directionally etched and after a patterned core material 805 is removed, where the plurality of patterned silicon oxide spacers 840 have a vertical slope. Without being limited by any theory, the stress distribution of having a moderate amount of compressive stress in the first thickness 820 and a moderate amount of compressive stress in the second thickness 830 in the silicon oxide spacer layer results in vertically sloped spacers 840 after spacer etch and patterned core removal. The amount of compressive stress in the second thickness 830 may be slightly greater than the amount of compressive stress in the first thickness 820.

Figure 9:
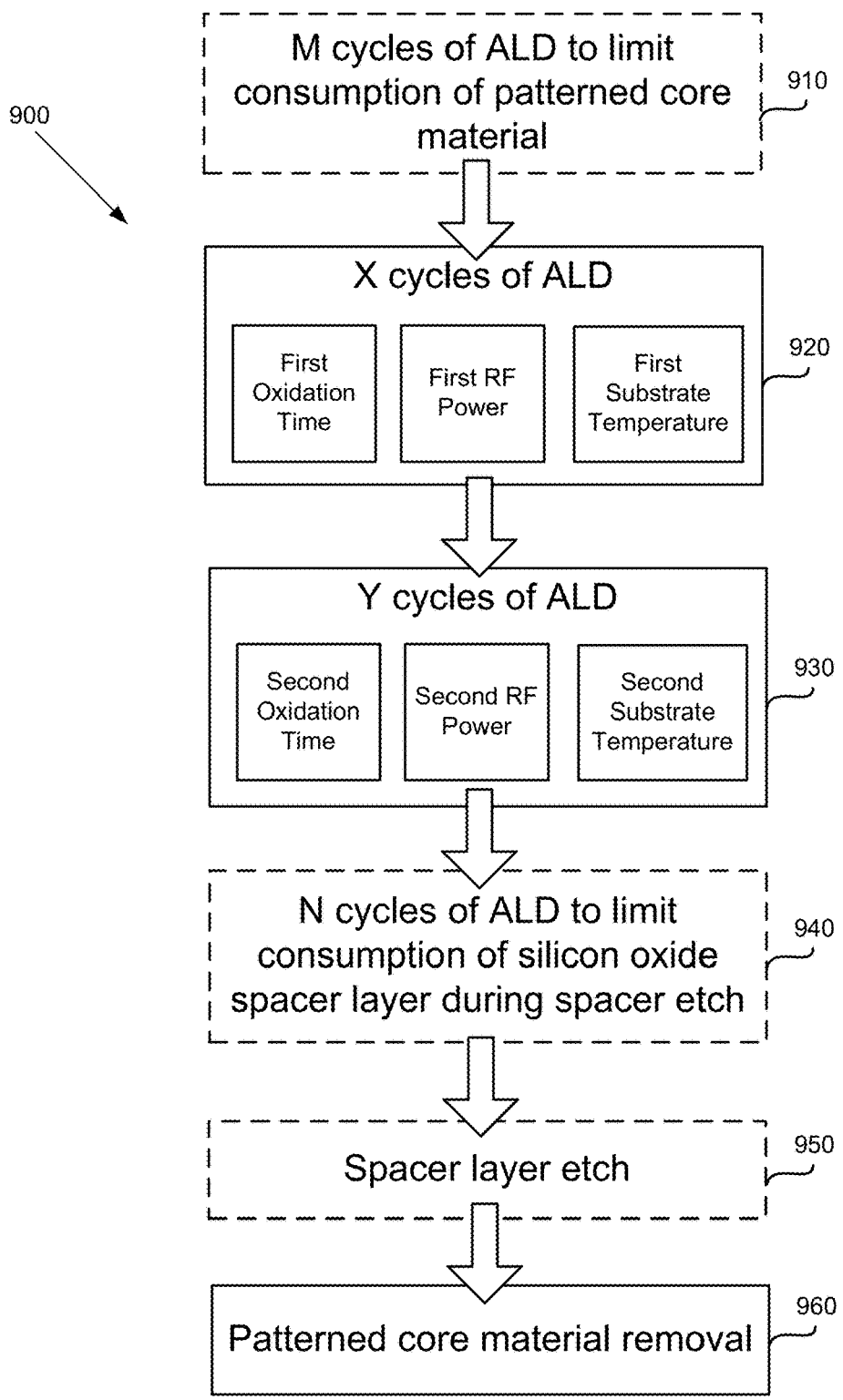
FIG. 9 shows a process flow diagram depicting various operations in a method for forming a plurality of silicon oxide spacers in a multiple patterning scheme according to some implementations.

FIG. 9 shows a process flow diagram depicting various operations in a method for forming a plurality of silicon oxide spacers in a multiple patterning scheme according to some implementations. The operations in a process 900 may be performed in different orders and/or with different, fewer, or additional operations. Various aspects of the process 500 in FIG. 5 may apply to the process 900 in FIG. 9.

In some implementations, at block 910 of the process 900, multiple cycles (M cycles) of ALD may be optionally performed to deposit a silicon oxide spacer layer on a patterned core material to limit subsequent consumption of patterned core material, where M is an integer value. When depositing a silicon oxide spacer layer, exposure to plasma of an oxidant for a long duration and at a high RF power may inadvertently consume portions of the patterned core material. Thus, each cycle of ALD at block 910 has a plasma conversion phase where exposure to plasma is for a short duration and performed at a low RF power to create a "soft landing" of silicon oxide material, thereby limiting subsequent consumption of the patterned core material.

At block 920 of the process 900, a first thickness of a silicon oxide spacer layer is deposited over the patterned core material by applying X cycles of ALD, where each cycle includes: (i) exposing the substrate to a first dose of a silicon-containing precursor, and (ii) exposing the substrate to plasma of an oxidant under a first oxidation condition. In some implementations, X is an integer value between about 10 and about 100. The first oxidation condition can include a first oxidation time, a first RF power, and a first substrate temperature. In some implementations, at least one of the first oxidation time, the first RF power, or the first substrate temperature may gradually change across the X number of cycles. Put another way, parameters such as the first oxidation time, the first RF power, and the first substrate temperature are not necessarily fixed during deposition of the first thickness of the silicon oxide spacer layer, but may change over time.

At block 930 of the process 900, a second thickness of the silicon oxide spacer layer is deposited over the first thickness by applying Y cycles of ALD, where each cycle includes: (i) exposing the substrate to a second dose of the silicon-containing precursor, and (ii) exposing the substrate to plasma of the oxidant under a second oxidation condition. In some implementations, Y is an integer value between about 10 and about 100. The second oxidation condition can include a second oxidation time, a second RF power, and a second substrate temperature. The second oxidation condition is different from the first oxidation condition by at least one of the oxidation time, the RF power, or the substrate temperature. In some implementations, at least one of the second oxidation time, the second RF power, or the second substrate temperature may gradually change across the Y number of cycles. Put another way, parameters such as the second oxidation time, the second RF power, and the second substrate temperature are not necessarily fixed during deposition of the second thickness of the silicon oxide spacer layer, but may change over time.

The first oxidation condition of each ALD cycle at block 920 and the second oxidation condition of each ALD cycle at block 930 may determine in part the slope of a resulting spacer following spacer etch at block 950 and patterned core removal at block 960. In some implementations, the first oxidation condition can include a low RF power and a short oxidation time and the second oxidation condition can include a high RF power and a long oxidation time for producing a positively sloped spacer. In some implementations, the first oxidation condition can include a high RF power and long oxidation time and the second oxidation condition can include a low RF power and a short oxidation time for producing a negatively sloped spacer. For example, low RF power may be between about 100 Watts and about 2,500 Watts and high RF power may be between about 1,000 Watts and about 5,000 Watts, and short oxidation time may be between about 0.25 seconds and about 1.5 seconds and long oxidation time may be between about 1 second and about 3 seconds.

The oxidation condition may gradually change from a first oxidation condition to a second oxidation condition across the X and Y number of ALD cycles at blocks 920 and 930. This can determine in part the slope of a resulting spacer following spacer etch at block 950 and patterned core removal at block 960. In some implementations, the first oxidation time may gradually change to the second oxidation time across the X and Y number of ALD cycles, and/or the first RF power may gradually change to the second RF power across the X and Y number of ALD cycles. In some implementations, the first oxidation time gradually increases to the second oxidation time and the first RF power gradually increases to the second RF power across the X and Y number of ALD cycles to produce a positively sloped spacer. In some implementations, the first oxidation time gradually decreases to the second oxidation time and the first RF power gradually decreases to the second RF power across the X and Y number of ALD cycles to produce a negatively sloped spacer.

The first substrate temperature at block 920 and the second substrate temperature 930 may determine in part the slope of the resulting spacer following spacer etch at block 950 and patterned core removal at block 960. In some implementations, the first substrate temperature can include a relatively low substrate temperature and the second substrate temperature can include a relatively high substrate temperature for producing a positively sloped spacer, which can occur regardless of the oxidation time and RF power delivered. In some implementations, the first substrate temperature can gradually increase to the second substrate temperature over the X and Y number of ALD cycles. In some implementations, the first substrate temperature can include a relatively high substrate temperature and the second substrate temperature can include a relatively low substrate temperature for producing a negatively sloped spacer, which can occur regardless of oxidation time and RF power delivered. In some implementations, the first substrate temperature can gradually decrease to the second substrate temperature over the X and Y number of ALD cycles. For example, a relatively low substrate temperature may be between about 0° C. and about 40° C. and a relatively high substrate temperature may be between about 40° C. and about 100° C.

In some implementations of the process 900, a third or additional thicknesses of the silicon oxide spacer layer may be deposited over the second thickness by applying more cycles of ALD. The ALD cycles in depositing the third or additional thicknesses of the silicon oxide spacer layer may occur using deposition/oxidation conditions different from deposition/oxidation conditions performed at blocks 920 and 930.

In some implementations, at block 940 of the process 900, multiple cycles (N cycles) of ALD may be optionally performed to deposit an additional thickness of the silicon oxide spacer layer over the second thickness of the silicon oxide spacer layer, where N is an integer value. When etching a portion of the silicon oxide spacer layer at block 950, excess amounts of the silicon oxide spacer layer may be inadvertently consumed. Thus, each cycle of ALD at block 940 has a plasma conversion phase where exposure to plasma is for long duration and performed at a high RF power to create a "high-quality" silicon oxide material, thereby limiting excess consumption of the silicon oxide spacer layer during spacer etch at block 950.

In some implementations, at block 950 of the process 900, a portion of the silicon oxide spacer layer is optionally etched or otherwise removed prior to patterned core removal at block 960. In some implementations, removal of the portion of the silicon oxide spacer layer leaves a remainder of the silicon oxide spacer layer adjacent to the patterned core material. The remainder of the silicon oxide spacer layer may be disposed along sidewalls of the patterned core material.

At block 960 of the process 900, the patterned core material is removed so that free-standing spacers from the silicon oxide spacer layer remain. The free-standing silicon oxide spacers may serve as a patterned mask layer for patterning a subsequent target layer. The free-standing spacers may have a slope depending on the deposition conditions applied during blocks 920 and 930. The free-standing spacers may have a negative, positive, or vertical slope.

Examples

Figure 10A:
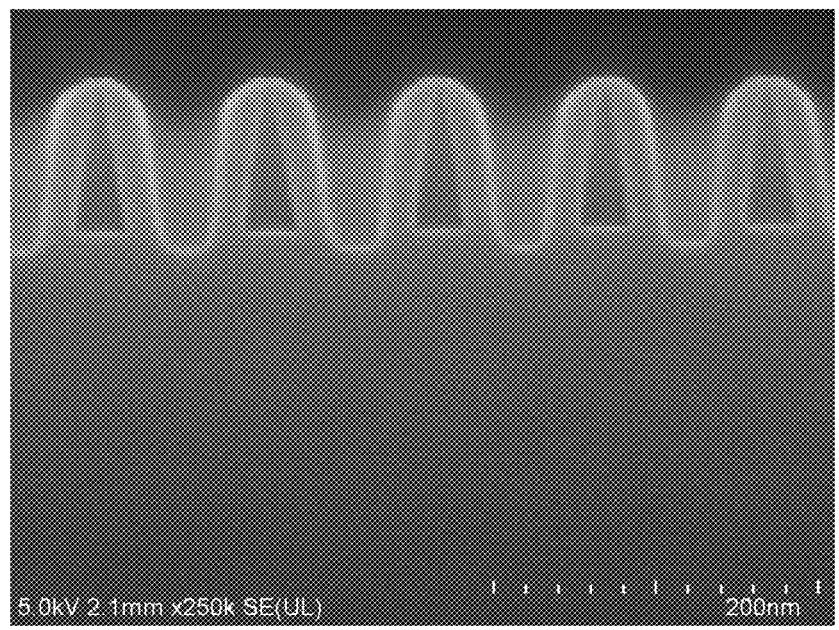
FIG. 10A shows an image of a plurality of silicon oxide spacers having a profile with a positive slope after removal of an amorphous carbon core.

FIG. 10A shows an image of a plurality of silicon oxide spacers having a profile with a positive slope after removal of an amorphous carbon core. To deposit a silicon oxide spacer layer on the amorphous carbon core, 60 cycles of ALD are performed with each cycle having an oxidation time of 0.5 seconds and a TCP power of 500 Watts, followed by 20 cycles of ALD with each cycle having an oxidation time of 1.5 seconds and a TCP power of 2,500 Watts, followed by an 11 second spacer etch, and followed by 50 cycles of ALD with each cycle having an oxidation time of 1.5 seconds and a TCP power of 2,500 Watts. To form the silicon oxide spacers with the positive slope shown in FIG. 10A, an 18 second spacer etch is performed followed by a 120 second oxygen strip for removal of the amorphous carbon core.

Figure 10B:
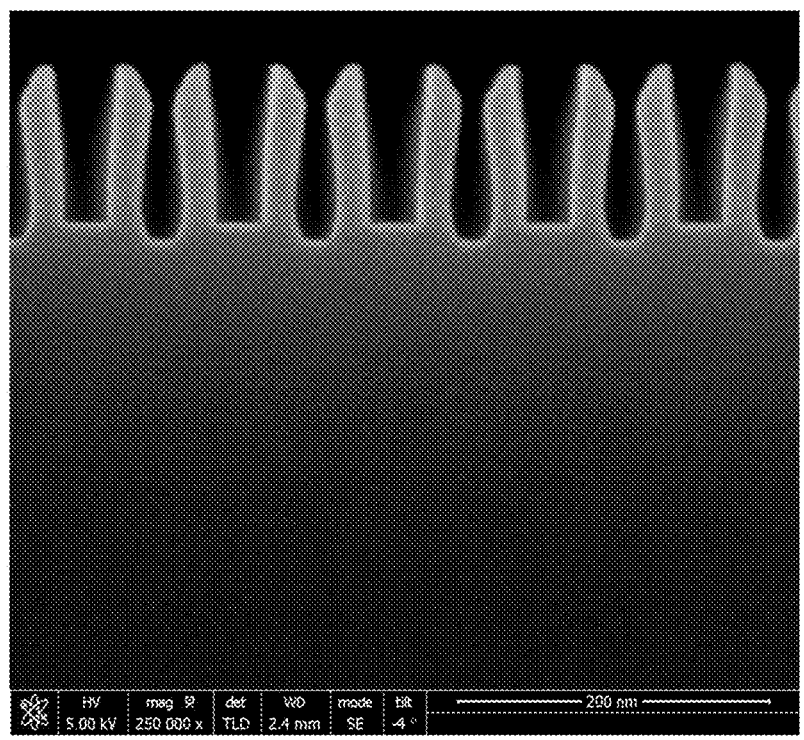
FIG. 10B shows an image of a plurality of silicon oxide spacers having a profile with a negative slope after removal of an amorphous carbon core.

FIG. 10B shows an image of a plurality of silicon oxide spacers having a profile with a negative slope after removal of an amorphous carbon core. To deposit a silicon oxide spacer layer on the amorphous carbon core, 15 cycles of ALD are performed with each cycle having an oxidation time of 0.5 seconds and a TCP power of 500 Watts, followed by 60 cycles of ALD with each cycle having an oxidation time of 1.5 seconds and a TCP power of 2,500 Watts, followed by an 11 second spacer etch, followed by 60 cycles of ALD with each cycle having an oxidation time of 0.5 seconds and a TCP power of 500 Watts, and followed by 15 cycles of ALD having an oxidation time of 1.5 seconds and a TCP power of 2,500 Watts. To form the silicon oxide spacers with the negative slope shown in FIG. 10B, an 18 second spacer etch is performed followed by a 120 second oxygen strip for removal of the amorphous carbon core.

Figure 11A:
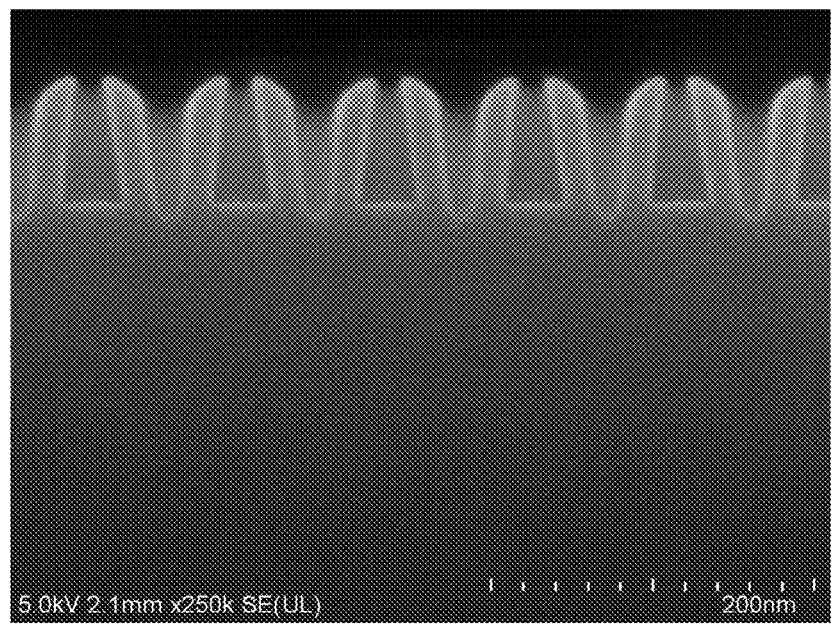
FIG. 11A shows an image of a plurality of silicon oxide spacers having a profile with a positive slope after removal of a spin-on carbon core.

FIG. 11A shows an image of a plurality of silicon oxide spacers having a profile with a positive slope after removal of a spin-on carbon core. To deposit a silicon oxide spacer layer on the spin-on carbon core, 60 cycles of ALD are performed with each cycle having an oxidation time of 0.5 seconds and a TCP power of 500 Watts, followed by 20 cycles of ALD with each cycle having an oxidation time of 1.5 seconds and a TCP power of 2,500 Watts, followed by an 11 second spacer etch, and followed by 50 cycles of ALD with each cycle having an oxidation time of 1.5 seconds and a TCP power of 2,500 Watts. To form the silicon oxide spacers with the positive slope shown in FIG. 11A, a 15 second spacer etch is performed followed by a 60 second oxygen strip for removal of the spin-on carbon core.

Figure 11B:
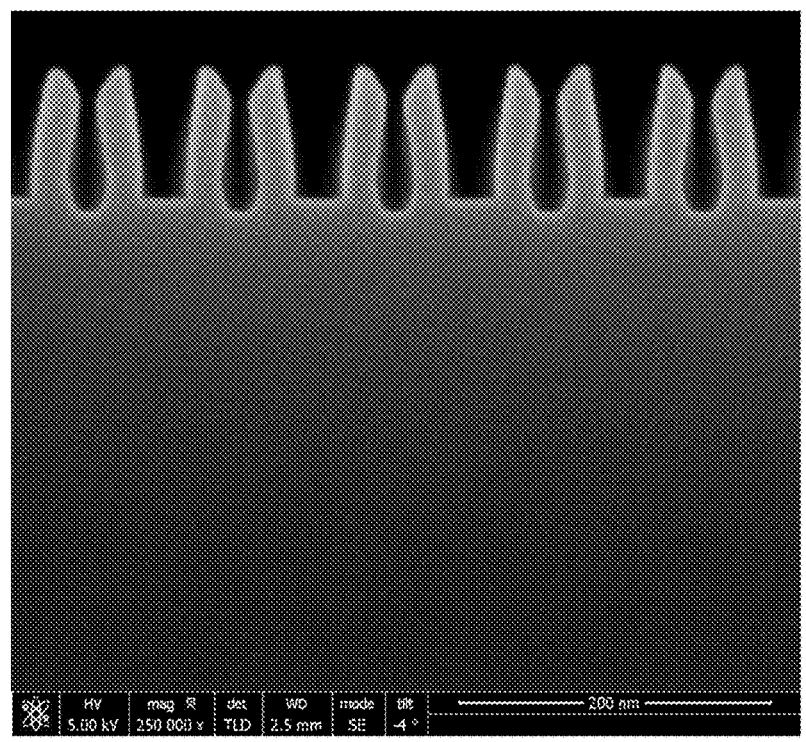
FIG. 11B shows an image of a plurality of silicon oxide spacers having a profile with a negative slope after removal of a spin-on carbon core.

FIG. 11B shows an image of a plurality of silicon oxide spacers having a profile with a negative slope after removal of a spin-on carbon core. To deposit a silicon oxide spacer layer on the spin-on carbon core, 15 cycles of ALD are performed with each cycle having an oxidation time of 0.5 seconds and a TCP power of 500 Watts, followed by 60 cycles of ALD with each cycle having an oxidation time of 1.5 seconds and a TCP power of 2,500 Watts, followed by an 11 second spacer etch, followed by 60 cycles of ALD with each cycle having an oxidation time of 0.5 seconds and a TCP power of 500 Watts, and followed by 15 cycles of ALD with each cycle having an oxidation time of 1.5 seconds and a TCP power of 2,500 Watts. To form the silicon oxide spacers with the negative slope shown in FIG. 11B, a 15 second spacer etch is performed followed by a 60 second oxygen strip for removal of the spin-on carbon core.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
    depositing, in a plasma chamber, a first thickness of a silicon oxide layer by atomic layer deposition (ALD) on a substrate, wherein the substrate includes a patterned core material and a target layer underlying the patterned core material, wherein depositing the first thickness of the silicon oxide layer by ALD includes exposing the substrate to a first dose of a silicon-containing precursor and exposing the substrate to plasma of an oxidant under a first oxidation condition;
    depositing, in the plasma chamber, a second thickness of the silicon oxide layer by ALD on the substrate, wherein depositing the second thickness of the silicon oxide layer by ALD includes exposing the substrate to a second dose of the silicon-containing precursor and exposing the substrate to plasma of the oxidant under a second oxidation condition, the second oxidation condition being different from the first oxidation condition; and
    etching, in the plasma chamber, a portion of the silicon oxide layer and the patterned core material to form a plurality of spacers, wherein the plurality of spacers comprise a remaining portion of the silicon oxide layer to serve as a mask for the target layer.

2. The method of claim 1, wherein the second oxidation condition is different from the first oxidation condition by one or more of the following: (1) an oxidation time, (2) a radio-frequency (RE) power, and (3) a substrate temperature.

3. The method of claim 2, wherein the oxidation time is between about 0.25 seconds and about 5 seconds for each of the first oxidation condition and the second oxidation condition.

4. The method of claim 2, wherein the RF power is between about 100 Watts and about 10,000 Watts for each of the first oxidation condition and the second oxidation condition.

5. The method of claim 2, wherein the substrate temperature is between about 0° C. and about 100° C. for each of the first oxidation condition and the second oxidation condition.

6. The method of claim 1, wherein the second oxidation condition includes a second oxidation time and a second RF power and the first oxidation condition includes a first oxidation time and a first RF power, the second oxidation time being greater than the first oxidation time and the second RF power being greater than the first RF power.

7. The method of claim 1, wherein the second oxidation condition includes a second oxidation time and a second RF power and the first oxidation condition includes a first oxidation time and a first RF power, the second oxidation time being less than the first oxidation time and the second RF power being less than the first RF power.

8. The method of claim 1, wherein the second oxidation condition includes a second substrate temperature and the first oxidation condition includes a first substrate temperature, wherein the second substrate temperature is different from the first substrate temperature.

9. The method of claim 8, further comprising:
    ramping a temperature of a substrate support from the first substrate temperature to the second substrate temperature.

10. The method of claim 1, wherein operations of depositing the first thickness of the silicon oxide layer, depositing the second thickness of the silicon oxide layer, and etching the portion of the silicon oxide layer and the patterned core material occur in the plasma chamber without introducing a vacuum break in between operations.

11. The method of claim 1, wherein a pressure in the plasma chamber is between about 1 mTorr and about 100 mTorr.

12. The method of claim 1, wherein etching the portion of the silicon oxide layer occurs prior to etching the patterned core material.

13. The method of claim 1, wherein depositing the first thickness of the silicon oxide layer includes applying X number of cycles of: (i) exposing the substrate to the first dose of the silicon-containing precursor, and (ii) exposing the substrate to the plasma of the oxidant under the first oxidation condition, and wherein depositing the second thickness of the silicon oxide layer includes applying Y number of cycles of: (iii) exposing the substrate to the second dose of the silicon-containing precursor, and (iv) exposing the substrate to the plasma of the oxidant under the second oxidation condition, wherein X and Y are integer values different from one another.

14. The method of claim 13, wherein the first oxidation condition includes a first oxidation time and the second oxidation condition includes a second oxidation time, the first oxidation time gradually changing across the X number of cycles and the second oxidation time gradually changing across the Y number of cycles.

15. The method of claim 13, wherein the first oxidation condition includes a first RF power and the second oxidation condition includes a second RF power, the first RF power gradually changing across the X number of cycles and the second RF power gradually changing across the Y number of cycles.

16. The method of claim 13, wherein exposing the substrate to plasma of the oxidant under the first oxidation condition includes converting the first dose of the silicon-containing precursor to form the first thickness of the silicon oxide layer, and wherein exposing the substrate to plasma of the oxidant under the second oxidation condition includes converting the second dose of the silicon-containing precursor to form the second thickness of the silicon oxide layer.

17. The method of claim 1, wherein the oxidant includes oxygen gas.

18. The method of claim 1, wherein the patterned core material includes a material selected from the group consisting of spin-on carbon, diamond-like carbon, and gapfill ashable hard mask.

19. The method of claim 1, wherein an upper portion of each of the plurality of spacers has a slope, wherein the slope is dependent at least in part on the first oxidation condition and the second oxidation condition.

20. An apparatus for controlling a slope of a plurality of silicon oxide spacers, the apparatus comprising:
a plasma chamber;
an RF power supply coupled to the plasma chamber and configured to deliver RF power to the plasma chamber;
a substrate support for supporting a substrate in the plasma chamber, wherein the substrate includes a patterned core material and a target layer under the patterned core material; and
a controller configured to perform the following instructions:
(i) deposit, in the plasma chamber, a first thickness of a silicon oxide layer by atomic layer deposition (ALD) on the substrate, wherein depositing the first thickness of the silicon oxide layer by ALD includes exposing the substrate to a first dose of a silicon-containing precursor and exposing the substrate to plasma of an oxidant under a first oxidation condition;
(ii) deposit, in the plasma chamber, a second thickness of the silicon oxide layer by ALD on the first thickness of the silicon oxide layer, wherein depositing the second thickness of the silicon oxide layer by ALD includes exposing the substrate to a second dose of the silicon-containing precursor and exposing the substrate to plasma of the oxidant under a second oxidation condition, the second oxidation condition being different from the first oxidation condition; and
(iii) etch, in the plasma chamber, a portion of the silicon oxide layer and the patterned core material to form a plurality of spacers, wherein the plurality of spacers comprise a remaining portion of the silicon oxide layer to serve as a mask for the target layer.

21. The apparatus of claim 20, wherein the second oxidation condition is different from the first oxidation condition by one or more of the following: (1) an oxidation time, (2) a radio-frequency (RF) power, and (3) a substrate temperature.

22. The apparatus of claim 20, wherein an upper portion of each of the plurality of spacers has a slope, wherein the slope is dependent at least in part on the first oxidation condition and the second oxidation condition.

* * * * *

UNITED STATES PATENT AND TRADEMARK OFFICE
CERTIFICATE OF CORRECTION

PATENT NO.        : 10,446,394 B2
APPLICATION NO.   : 15/881506
DATED             : October 15, 2019
INVENTOR(S)       : Abatchev et al.

Page 1 of 1

It is certified that error appears in the above-identified patent and that said Letters Patent is hereby corrected as shown below:

In Claim 2, Column 28, Line 28:
"Radio-frequency (RE) Power, and (3) a substrate temperature." Change to -- Radio-frequency (RF) Power, and (3) a substrate temperature. --

Signed and Sealed this
Eighteenth Day of February, 2020

Andrei Iancu
*Director of the United States Patent and Trademark Office*